(12) United States Patent
Fujikane et al.

(10) Patent No.: US 12,167,692 B2
(45) Date of Patent: *Dec. 10, 2024

(54) THERMOELECTRIC CONVERSION DEVICE, METHOD FOR CONTROLLING THERMOELECTRIC CONVERSION DEVICE, METHOD FOR COOLING AND/OR HEATING OBJECT BY USING THERMOELECTRIC CONVERSION DEVICE, AND ELECTRONIC DEVICE

(71) Applicant: Panasonic Intellectual Property Management Co., Ltd., Osaka (JP)

(72) Inventors: Masaki Fujikane, Osaka (JP); Kouhei Takahashi, Osaka (JP); Naoki Tambo, Kyoto (JP); Kunihiko Nakamura, Osaka (JP); Yasuyuki Naito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 157 days.

This patent is subject to a terminal disclaimer.

(21) Appl. No.: 17/702,859

(22) Filed: Mar. 24, 2022

(65) Prior Publication Data

US 2022/0216388 A1 Jul. 7, 2022

Related U.S. Application Data

(63) Continuation of application No. PCT/JP2020/037791, filed on Oct. 6, 2020.

(30) Foreign Application Priority Data

Oct. 25, 2019 (JP) .................. 2019-194772

(51) Int. Cl.
*H10N 10/17* (2023.01)
*H10N 10/13* (2023.01)
(Continued)

(52) U.S. Cl.
CPC ............. *H10N 10/82* (2023.02); *H10N 10/13* (2023.02); *H10N 10/17* (2023.02); *H10N 19/101* (2023.02); *H10N 10/01* (2023.02)

(58) Field of Classification Search
CPC ........ H10N 10/00; H10N 10/17; H10N 10/85; H10N 10/81; H10N 19/00; H10N 19/101
See application file for complete search history.

(56) References Cited

U.S. PATENT DOCUMENTS

| 8,508,370 B1 | 8/2013 | El-Kady et al. |
| 2011/0095390 A1 | 4/2011 | Sakai et al. |

(Continued)

FOREIGN PATENT DOCUMENTS

| CN | 108701749 A | 10/2018 |
| JP | 7-058416 | 3/1995 |

(Continued)

OTHER PUBLICATIONS

International Search Report of PCT application No. PCT/JP2020/037791 dated Dec. 28, 2020.

(Continued)

*Primary Examiner* — Christina Chern
(74) *Attorney, Agent, or Firm* — Rimon P.C.

(57) ABSTRACT

A thermoelectric conversion device includes: an insulating layer; and a thermoelectric conversion module disposed on the insulating layer. The thermoelectric conversion module has a first thermoelectric conversion region and a second thermoelectric conversion region. The first(second) thermoelectric conversion region includes one or two or more thermoelectric conversion elements, a first(third) connection electrode, and a second(fourth) connection electrode. The thermoelectric conversion elements of the first(second) thermoelectric conversion region are electrically connected to the first(third) connection electrode and the second(fourth) connection electrode and located on an electric path connecting these connection electrodes. Each of the thermoelectric conversion elements includes a thermoelectric converter. The thermoelectric converter of at least one of the thermoelectric conversion elements has a phononic crystal layer having a phononic crystal structure including a plurality of regularly arranged through holes. A through direction of the plurality of through holes in this crystal structure is substantially parallel to a direction perpendicular to a principal surface of the insulating layer.

21 Claims, 23 Drawing Sheets

(51) Int. Cl.
*H10N 10/82* (2023.01)
*H10N 19/00* (2023.01)
*H10N 10/01* (2023.01)

(56) References Cited

U.S. PATENT DOCUMENTS

| | | |
|---|---|---|
| 2012/0295074 A1 | 11/2012 | Yi et al. |
| 2013/0019918 A1* | 1/2013 | Boukai ............ H01L 21/30604 |
| | | 438/54 |
| 2013/0255738 A1 | 10/2013 | Mitrovic et al. |
| 2014/0373888 A1 | 12/2014 | Boukai et al. |
| 2017/0047499 A1 | 2/2017 | Hussein |
| 2017/0069818 A1 | 3/2017 | Mitrovic et al. |
| 2019/0067548 A1 | 2/2019 | Nakada |

FOREIGN PATENT DOCUMENTS

| | | |
|---|---|---|
| JP | 2003-179204 | 6/2003 |
| JP | 2007-115812 A | 5/2007 |
| JP | 2014-503996 | 2/2014 |
| JP | 2017-152691 | 8/2017 |
| WO | 2011/048634 | 4/2011 |
| WO | 2019/157408 A1 | 8/2019 |

OTHER PUBLICATIONS

M. Nomura et al., "Impeded thermal transport in Si multiscale hierarchical architectures with phononic crystal nanostructures", Physical Review B 91, 205422 (2015), May 15, 2015.
1 The EPC Office Action dated Nov. 21, 2022 for the related European Patent Application No. 20878079.1.
English Translation of Chinese Search Report dated May 23, 2024 for the related Chinese Patent Application No. 202080071284.7.

* cited by examiner

THERMOELECTRIC CONVERSION DEVICE, METHOD FOR CONTROLLING THERMOELECTRIC CONVERSION DEVICE, METHOD FOR COOLING AND/OR HEATING OBJECT BY USING THERMOELECTRIC CONVERSION DEVICE, AND ELECTRONIC DEVICE

TECHNICAL FIELD

The present disclosure relates to a thermoelectric conversion device, a method for controlling the thermoelectric conversion device, a method for cooling and/or heating an object using the thermoelectric conversion device, and an electronic device including the thermoelectric conversion device.

BACKGROUND ART

PTL 1, PTL 2, and NPL 1 disclose periodic structures including a plurality of through holes. In these periodic structures, the through holes are regularly arranged in a thin film with a period of the order of nanometers (in the range of 1 nm to 1000 nm) in plan view. Each periodic structure is one type of phononic crystal structure. The phononic crystal structure of such a type generally has a unit cell that is a minimum unit forming the arrangement of the through holes. With this phononic crystal structure, the thermal conductivity of the thin film can be reduced. The thermal conductivity of a thin film can be reduced also by, for example, porosification. This is because the pores introduced into the thin film by the porosification reduce the thermal conductivity of the thin film. However, in the thin film having the phononic crystal structure, the thermal conductivity of the base material itself forming the thin film can be reduced. Therefore, it is expected to further reduce the thermal conductivity of such a thin film as compared with that achieved by simple porosification.

A thermoelectric conversion element including a thermoelectric converter containing a thermoelectric conversion material is a known art. The use of the thermoelectric conversion element allows a thermoelectric conversion device to be constructed. The thermoelectric conversion device can cool and/or heat an object by utilizing the Peltier effect. PTL 3 discloses a thermoelectric conversion element including a p-type thermoelectric conversion material and an n-type thermoelectric conversion material.

CITATION LIST

Patent Literature

PTL 1: U.S. Patent Application Publication No. 2017/0047499
PTL 2: U.S. Patent Application Publication No. 2017/0069818
PTL 3: International Publication No. WO2011/048634

Non Patent Literature

NPL 1: Nomura et al., "Impeded thermal transport in Si multiscale hierarchical architectures with phononic crystal nanostructures", Physical Review B 91, 205422 (2015)

SUMMARY OF INVENTION

Technical Problem

The present disclosure provides a thermoelectric conversion device that can cool and/or heat an object with a high degree of flexibility and is, for example, suitable for maintaining variations in the temperature of the object within a prescribed range.

Solution to Problem

The present disclosure provides the following thermoelectric conversion device.

A thermoelectric conversion device including:
an insulating layer; and
a thermoelectric conversion module disposed on the insulating layer,
wherein the thermoelectric conversion module has a first thermoelectric conversion region and a second thermoelectric conversion region,
wherein the first thermoelectric conversion region includes one or two or more thermoelectric conversion elements, a first connection electrode, and a second connection electrode,
wherein the thermoelectric conversion elements in the first thermoelectric conversion region are electrically connected to the first connection electrode and the second connection electrode and located on an electric path connecting the first connection electrode and the second connection electrode,
wherein the second thermoelectric conversion region includes one or two or more thermoelectric conversion elements, a third connection electrode, and a fourth connection electrode,
wherein the thermoelectric conversion elements in the second thermoelectric conversion region are electrically connected to the third connection electrode and the fourth connection electrode and located on an electric path connecting the third connection electrode and the fourth connection electrode,
wherein each of the thermoelectric conversion elements includes a thermoelectric converter,
wherein the thermoelectric converter of at least one of the thermoelectric conversion elements includes a phononic crystal layer having a phononic crystal structure including a plurality of regularly arranged through holes, and
wherein a through direction of the plurality of through holes in the phononic crystal structure is substantially parallel to a direction perpendicular to a principal surface of the insulating layer.

The present disclosure can provide a thermoelectric conversion device that can cool and/or heat an object with a high degree of flexibility and is, for example, suitable for maintaining variations in the temperature of the object within a prescribed range.

DESCRIPTION OF EMBODIMENTS (Findings Underlying the Present Disclosure)

The thermoelectric conversion device of the present disclosure includes a thermoelectric conversion module including a plurality of thermoelectric conversion regions. The thermoelectric conversion regions can be controlled independently through connection electrodes disposed in the respective regions. For example, a thermoelectric conversion region close to an object is controlled differently from a thermoelectric conversion region away from the object. In this manner, the degree of flexibility in controlling cooling and/or heating of the object can be increased.

Moreover, the thermoelectric conversion device of the present disclosure includes a thermoelectric conversion element including a thermoelectric converter having a phononic crystal structure. This can enhance the thermal insulation performance of the thermoelectric conversion module including the above element, typically the thermal insulation performance in the thickness and in-plane directions of the thermoelectric conversion module and the thermoelectric conversion device. The thermal insulation performance enhanced in the thickness direction improves the thermoelectric conversion efficiency of the thermoelectric conversion module. The thermal insulation performance enhanced in the in-plane directions improves the degree of flexibility in the control patterns for the plurality of thermoelectric conversion regions when these regions are controlled independently. These contribute synergistically to the improvement in the degree of flexibility in controlling the cooling and/or heating of the object.

Embodiments of the Present Disclosure

Embodiments of the present disclosure will be described with reference to the drawings. The embodiments described below show general or specific examples. Numerical values, shapes, materials, components, arrangements and connections of the components, process conditions, steps, the order of the steps, etc. shown in the following embodiments are merely examples and are not intended to limit the present disclosure. Among the components in the following embodiments, components not described in an independent claim representing the broadest concept will be described as optional components. The drawings are schematic drawings and are not necessarily strictly accurate illustrations.

[Thermoelectric Conversion Device]

First Embodiment

Figure 1A:
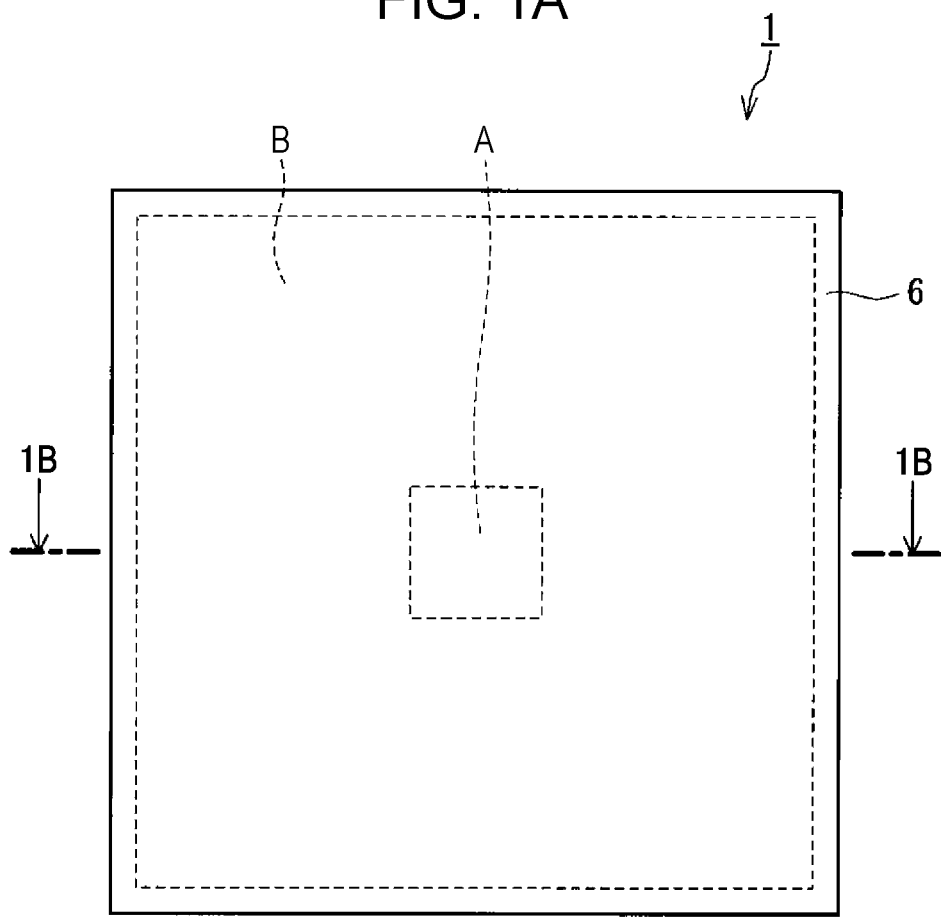
FIG. 1A is a plan view schematically showing an example of the thermoelectric conversion device of the present disclosure.
Figure 1B:
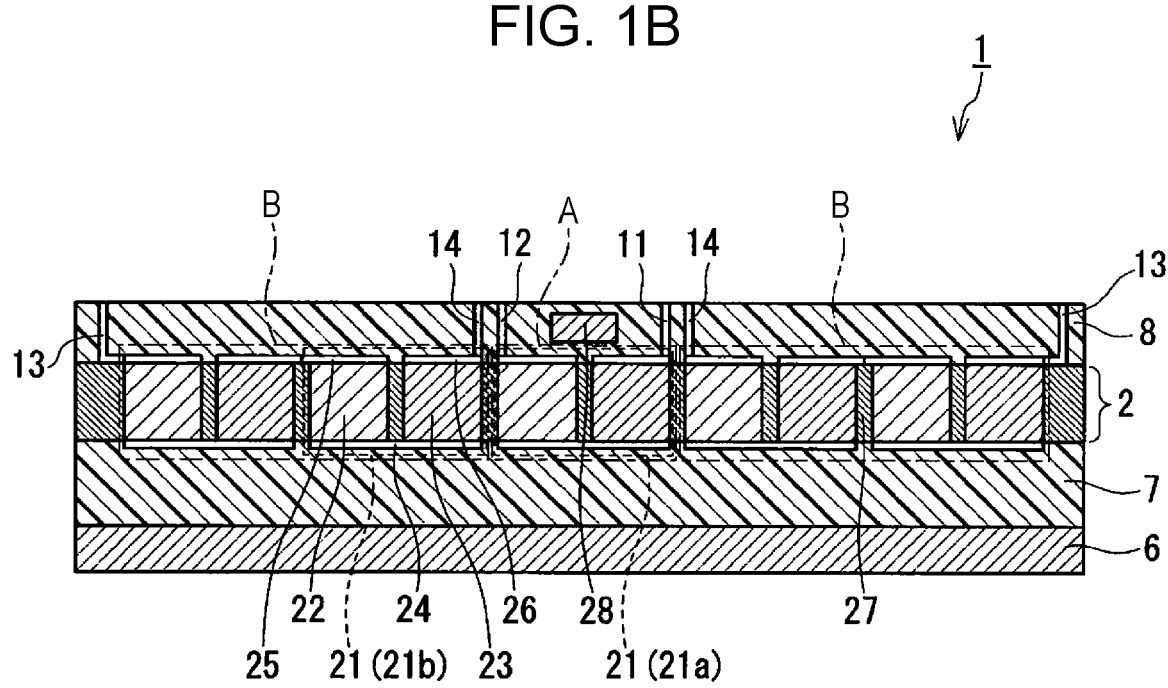
FIG. 1B is a cross-sectional view showing a cross section 1B-1B of the thermoelectric conversion device in FIG. 1A.

A thermoelectric conversion device in a first embodiment is shown in FIGS. 1A and 1B. FIG. 1B shows a cross section 1B-1B of the thermoelectric conversion device 1 in FIG. 1A. The thermoelectric conversion device 1 in FIGS. 1A and 1B includes an insulating layer 7 and a thermoelectric conversion module 2. The thermoelectric conversion module 2 is disposed on the insulating layer 7. The thermoelectric conversion module 2 has a layer shape. The thermoelectric conversion module 2 has a first thermoelectric conversion region A and a second thermoelectric conversion region B. The first thermoelectric conversion region A has a square shape when viewed in a direction X perpendicular to a principal surface of the insulating layer 7. The second thermoelectric conversion region B has a square outer shape when viewed in the direction X and surrounds the first thermoelectric conversion region A. The direction X is also the thickness direction of the thermoelectric conversion device 1 and also the thickness direction of the thermoelectric conversion module 2. The first thermoelectric conversion region A and the second thermoelectric conversion region B are adjacent to each other. The first thermoelectric conversion region A and the second thermoelectric conversion region B are located in the same layer. However, in the thermoelectric conversion device of the present disclosure, the arrangement form of the thermoelectric conversion regions included in the thermoelectric conversion module and their shapes when they are viewed in the direction X are not limited to the above examples.

The first thermoelectric conversion region A includes one or two or more thermoelectric conversion elements 21(21a), a first connection electrode 11, and a second connection electrode 12. The thermoelectric conversion elements 21a in the first thermoelectric conversion region A are electrically connected to the first connection electrode 11 and the second connection electrode 12. The thermoelectric conversion elements 21a are located on an electric path connecting the first connection electrode 11 and the second connection electrode 12. When the first thermoelectric conversion region A includes two or more thermoelectric conversion elements 21a. Each of the thermoelectric conversion elements 21a may be electrically connected to the first connection electrode 11 or the second connection electrode 12 directly or indirectly through another thermoelectric conversion element 21a. Two or more thermoelectric conversion elements 21a may be electrically connected to each other in series between the first connection electrode 11 and the second connection electrode 12. However, no limitation is imposed on the electrical connection form of the thermoelectric conversion elements 21a between the first connection electrode 11 and the second connection electrode 12. For example, a combination of series and parallel connections may be used. By applying a voltage through the first connection electrode 11 and the second connection electrode 12, the thermoelectric conversion elements 21a and the first thermoelectric conversion region A operate as Peltier elements and a Peltier module, respectively. The Peltier module is, for example, a Peltier-type cooling module, a Peltier-type cooling/heating module, or a Peltier type heating module.

The second thermoelectric conversion region B includes one or two or more thermoelectric conversion elements 21(21b), a third connection electrode 13, and a fourth connection electrode 14. The thermoelectric conversion elements 21b in the second thermoelectric conversion region B are electrically connected to the third connection electrode 13 and the fourth connection electrode 14. Each of the thermoelectric conversion elements 21b in the example in FIGS. 1A and 1B is electrically connected to the third connection electrode 13 or the fourth connection electrode 14 directly or indirectly through another thermoelectric conversion element 21b. The thermoelectric conversion elements 21b are located on an electric path connecting the third connection electrode 13 and the fourth connection electrode 14. In the example in FIGS. 1A and 1B, two or more thermoelectric conversion elements 21b are electrically connected to each other in series between the third connection electrode 13 and the fourth connection electrode 14. However, no limitation is imposed on the electrical connection form of the thermoelectric conversion elements 21b between the third connection electrode 13 and the fourth connection electrode 14. For example, a combination of series and parallel connections may be used. By applying a voltage through the third connection electrode 13 and the fourth connection electrode 14, the thermoelectric conversion elements 21b and the second thermoelectric conversion region B operate as Peltier elements and a Peltier module, respectively.

In each of the first thermoelectric conversion region A and the second thermoelectric conversion region B, two or more thermoelectric conversion elements 21 are typically arranged in an array.

The electrical connection form of the thermoelectric conversion elements 21 in the first thermoelectric conversion region A may be the same as or different from the electrical connection form of the thermoelectric conversion elements 21 in the second thermoelectric conversion region B.

In the example in FIGS. 1A and 1B, the number of first connection electrodes 11, the number of second connection electrodes 12, the number of third connection electrodes 13, and the number of fourth connection electrodes 14 are each 1. However, the number of connection electrodes may be two or more.

The voltage applied between the first connection electrode 11 and the second connection electrode 12 and the voltage applied between the third connection electrode 13 and the fourth connection electrode 14 can be controlled independently. This allows the first thermoelectric conversion region A and the second thermoelectric conversion region B to be controlled independently. For example, a first voltage may be applied to the first thermoelectric conversion region A, and a second voltage with an application pattern different from that of the first voltage may be applied to the second thermoelectric conversion region B.

The thermoelectric conversion device 1 in FIGS. 1A and 1B further includes a substrate (base layer) 6 and a protective layer 8. The protective layer 8 is disposed on the thermoelectric conversion module 2. The protective layer 8 is disposed as an outermost layer of the thermoelectric conversion device 1 (the outermost layer on the side opposite to the substrate 6). The thermoelectric conversion device 1 has a structure including the substrate 6, the insulating layer 7, the thermoelectric conversion module 2, and the protective layer 8 stacked in this order. The first connection electrode 11, the second connection electrode 12, the third connection electrode 13, and the fourth connection electrode 14 are via lines embedded in through holes passing through the protective layer 8 and extending in the direction X, reach the upper surface of the protective layer 8, and are exposed at the upper surface. The exposed end of each of the connection electrodes can be, for example, a connection point for a controller and/or a control module that controls the voltage applied to the first thermoelectric conversion region A or the second thermoelectric conversion region B.

Each thermoelectric conversion element 21 includes a p-type thermoelectric converter 22 and an n-type thermoelectric converter 23 that serve as thermoelectric converters and further includes a first electrode 24, a second electrode 25, and a third electrode 26. A first end of the p-type thermoelectric converter 22 and a first end of the n-type thermoelectric converter 23 are electrically connected through the first electrode 24. A second end of the p-type thermoelectric converter 22 is electrically connected to the second electrode 25. A second end of the n-type thermoelectric converter 23 is electrically connected to the third electrode 26. One selected from the second electrode 25 and the third electrode 26 is disposed on the electric path connecting the corresponding connection electrodes and located on the upstream side in the path. The other selected from the second electrode 25 and the third electrode 26 is disposed on the electric path connecting the corresponding connection electrodes and located on the downstream side in the path. In other words, a voltage can be applied to the thermoelectric conversion element 21 through the second electrode 25 and the third electrode 26. The second electrode 25 of each of the thermoelectric conversion elements 21 is electrically connected to the third electrode of an adjacent one of the thermoelectric conversion elements 21. The upstream and downstream sides in the electric path may be determined, for example, based on the direction of the electric current flowing through the path when a typical voltage is applied to the thermoelectric conversion region. In each thermoelectric conversion element 21, the direction in which a pair of electrodes sandwiching the thermoelectric converter therebetween are connected is generally the direction X. In other words, the direction in which the flow of heat is controlled in the thermoelectric conversion elements 21 and the thermoelectric conversion device 1 is generally the direction X. In each of the thermoelectric conversion elements 21 in FIGS. 1A and 1B, an insulating portion 27 is disposed between the p-type thermoelectric converter 22 and the n-type thermoelectric converter 23, and this configuration allows electric insulation between the thermoelectric converters 22 and 23 to be maintained.

The p-type thermoelectric converter 22 and/or the n-type thermoelectric converter 23 in each thermoelectric conversion element 21, typically each of the p-type thermoelectric converter 22 and the n-type thermoelectric converter 23, includes a phononic crystal layer. The phononic crystal layer has a plurality of regularly arranged through holes. The through direction of the plurality of through holes in the phononic crystal structure is substantially parallel to the direction X perpendicular to the principal surface of the insulating layer 7. The phononic crystal layer includes, for example, a first phononic crystal layer and a second phononic crystal layer described later. The through holes include, for example, first through holes and second through holes described later. In embodiment 1, all the thermoelectric conversion elements 21 include the respective phononic crystal layers. However, not all the thermoelectric conversion element 21 may include the phononic crystal layers. The term "substantially parallel" as used herein means that, even when the relation between two directions deviates from a parallel relation by, for example, 5 degrees or less, preferably 3 degrees of less, and more preferably 1 degree or less, these directions are regarded as parallel to each other.

In insulators and semiconductors, heat is transferred mainly by lattice vibrations called phonons. The thermal conductivity of a material composed of an insulator or a semiconductor is determined by the dispersion relation of phonons in the material. The dispersion relation of phonons means the relation between their frequency and wavenumber or the band structure of phonons. In insulators and semiconductors, phonons that transfer heat are present in a wide frequency band of from 100 GHz to 10 THz. This frequency band is a thermal band. The thermal conductivity of a material is determined by the dispersion relation of phonons in the thermal band. In the phononic crystal structures, the dispersion relation of phonons in the material can be controlled by the periodic structure formed from the through holes. In other words, in a thermoelectric converter having a phononic crystal structure, the thermal conductivity itself of the material of the thermoelectric converter such as its base material can be controlled. In particular, the formation of a phononic band gap (PBG) by the phononic crystal structure can significantly reduce the thermal conductivity of the material. No phonons are allowed to be present in the PBG. Therefore, the PBG located in the thermal band can serve as a gap for thermal conduction. Moreover, in frequency bands other than the PBG, the gradients of the phonon dispersion curves are reduced by the PBG. The reduction in the gradients reduces the group velocity of phonons, causing a reduction in the speed of heat conduction. These characteristics significantly contribute to a reduction in the thermal conductivity itself of the material.

<Phononic Crystal Structure>

A description will be given of a phononic crystal structure that the thermoelectric converter of each thermoelectric conversion element 21 can have. The p-type thermoelectric converter 22 is exemplified as the thermoelectric converter. The n-type thermoelectric converter 23 can also have the phononic crystal structure described below.

Figure 2:
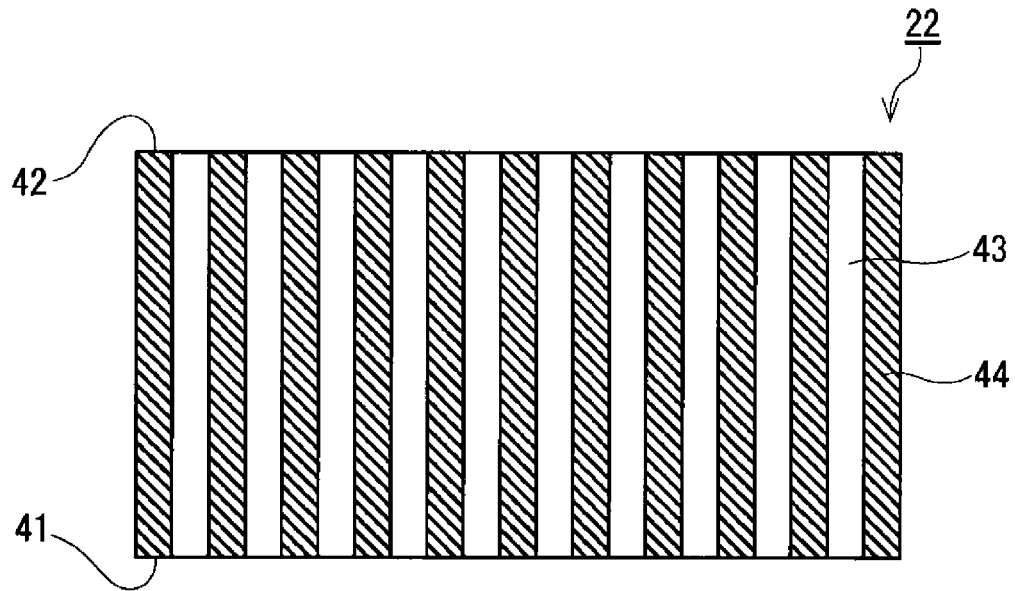
FIG. 2 is a cross-sectional view schematically showing an example of a thermoelectric converter in a thermoelectric conversion element that the thermoelectric conversion device of the present disclosure can have.

FIG. 2 shows an example of the p-type thermoelectric converter 22. The p-type thermoelectric converter 22 in FIG. 2 includes a first phononic crystal layer 44 having a first phononic crystal structure including a plurality of first through holes 43 arranged regularly. The p-type thermoelectric converter 22 in FIG. 2 is a monolayer structural body including the first phononic crystal layer 44. The through direction of the plurality of first through holes 43 in the first phononic crystal structure and in the first phononic crystal layer 44 is a direction connecting a first end 41 of the p-type thermoelectric converter 22 and its second end 42. The first electrode 24 is disposed on the first end 41. The second electrode 25 is disposed on the second end 42. The above direction is substantially perpendicular to the connection surface between the p-type thermoelectric converter 22 and the first electrode 24 and the connection surface between the p-type thermoelectric converter 22 and the second electrode 25. The term "substantially perpendicular" as used herein means that, even when the relation between two directions deviates from a perpendicular relation by, for example, 5 degrees or less, preferably 3 degrees or less, and more preferably 1 degree or less, these directions are regarded as perpendicular to each other.

Figure 3:
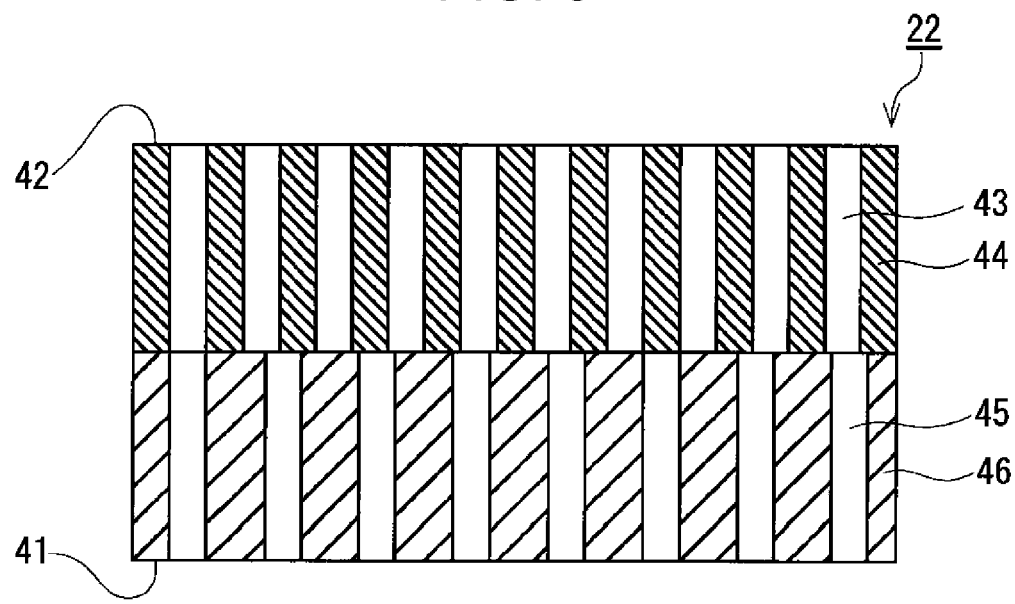
FIG. 3 is a cross-sectional view schematically showing another example of the thermoelectric converter in the thermoelectric conversion element that the thermoelectric conversion device of the present disclosure can have.

Another example of the p-type thermoelectric converter 22 is shown in FIG. 3. The p-type thermoelectric converter 22 shown in FIG. 3 further includes, in addition to the first phononic crystal layer 44, a second phononic crystal layer 46 having a second phononic crystal structure including a plurality of second through holes 45 arranged regularly. The first phononic crystal layer 44 and the second phononic crystal layer 46 are stacked in a direction connecting the first end 41 and the second end 42 of the p-type thermoelectric converter 22. The first phononic crystal layer 44 and the second phononic crystal layer 46 are stacked in the direction X. The through direction of the plurality of first through holes 43 in the first phononic crystal structure and in the first phononic crystal layer 44 is substantially parallel to the through direction of the plurality of second through holes 45 in the second phononic crystal structure and in the second phononic crystal layer 46. The p-type thermoelectric converter 22 in FIG. 3 is a multilayer structural body including the first phononic crystal layer 44 and the second phononic crystal layer 46. The first phononic crystal layer 44 and the second phononic crystal layer 46 are in contact with each other.

The PBG is distributed three-dimensionally, and it is expected that a heat flow in each phononic crystal layer can be controlled not only in its in-plane directions but also in its thickness direction and that the thermal conductivity can be reduced by controlling the heat flow. The phrase "the thickness direction of a phononic crystal layer" means the through direction of a plurality of regularly arranged through holes in FIGS. 2 and 3. In the p-type thermoelectric converter 22 in FIG. 3, at least two phononic crystal layers are stacked in the thickness direction. It is expected that the stack with an increased thickness will allow the heat flow in the p-type thermoelectric converter 22 in the thickness direction to be controlled more reliably.

The thickness of the first phononic crystal layer 44 and the thickness of the second phononic crystal layer 46 are, for example, equal to or more than 10 nm and equal to or less than 500 nm. When the p-type thermoelectric converter 22 includes two or more phononic crystal layers, the thicknesses of these phononic crystal layers may be the same as or different from each other.

No limitation is imposed on the number of phononic crystal layers included in the p-type thermoelectric converter 22. When the p-type thermoelectric converter 22 includes two or more phononic crystal layers, the phononic crystal layers may be stacked in contact with each other or may be stacked with another member interposed therebetween. The other member is, for example, an oxide film such as a $SiO_2$ film or a buffer layer described later.

Figure 4:
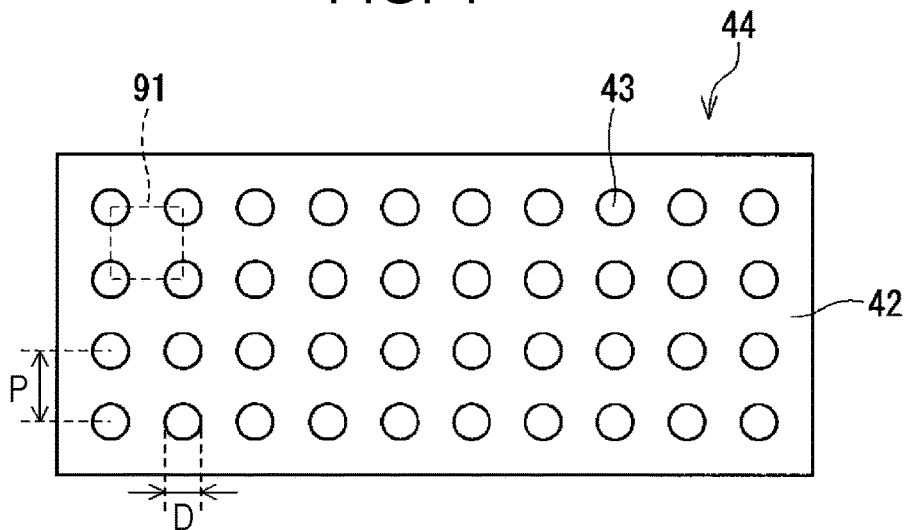
FIG. 4 is a plan view when the thermoelectric converter in FIG. 3 is viewed from a first phononic crystal layer side.
Figure 5:
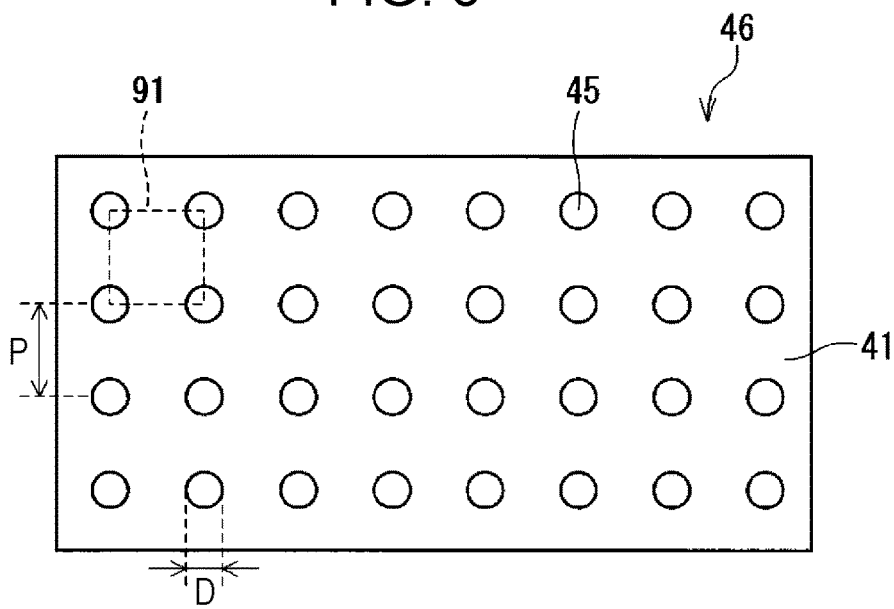
FIG. 5 is a plan view when the thermoelectric converter in FIG. 3 is viewed from a second phononic crystal layer side.

FIG. 4 is a plan view showing the p-type thermoelectric converter 22 in FIG. 3 when it is viewed from the first phononic crystal layer 44 side. FIG. 5 is a plan view showing the p-type thermoelectric converter 22 in FIG. 3 when it is viewed from the second phononic crystal layer 46 side. In the p-type thermoelectric converter 22 in FIGS. 3, 4, and 5, the first phononic crystal structure that the first phononic crystal layer 44 has structurally differs from the second phononic crystal structure that the second phononic crystal layer 46 has. Specifically, the period P of the arrangement of the first through holes 43 differs from the period P of the arrangement of the second through holes 45. When the first phononic crystal structure structurally differs from the second phononic crystal structure, at least part of the second through holes 45 are generally not in communication with the first through holes 43. In a p-type thermoelectric converter 22 including two or more phononic crystal layers, the phononic crystal layers may be structurally the same as each other.

The thickness of the phononic crystal layers 44 and 46 that corresponds to the length of the through holes 43 and 45 may be equal to or larger than twice the diameter of the through holes. In this case, the distance between the upper and lower surfaces of each of the phononic crystal layers 44 and 46 can be increased. This allows the temperature difference between the upper and lower surfaces of each of the phononic crystal layers 44 and 46 to be increased, so that the thermoelectric conversion efficiency can be improved. As used herein, the term "the upper surface" and "the lower surface" of a phononic crystal layer mean, respectively, one principal surface of the phononic crystal layer and the other principal surface facing the one principal surface when the phononic crystal layer is viewed in the through direction of the through holes. The term "the principal surface" means a surface having the largest area. The upper limit of the thickness of each of the phononic crystal layers 44 and 46 is, for example, equal to or less than 100 times the diameter of the through holes and may be equal to or less than 80 times, equal to or less than 60 times, and equal to or less than 50 times the diameter of the through holes.

The ratio of the total volume of the through holes 43 or 45 included in each of the phononic crystal layers 44 and 46 to the volume of the each of the phononic crystal layers 44 and 46, i.e., the porosity of the phononic crystal layer, may be equal to or more than 10%. In this case, the volumes of the phononic crystal layers 44 and 46 excluding the through holes 43 and 45 can be reduced, so that the effect of the PBG can be increased. Therefore, the thermal conductivity of each of the phononic crystal layers 44 and 46 can be further reduced, and the thermoelectric conversion efficiency can be increased. The upper limit of the porosity of each of the phononic crystal layers 44 and 46 is, for example, equal to or lower than 90% and may be equal or lower than 70%, equal to or lower than 50%, and equal to or lower than 40%.

Examples of the case where the first phononic crystal structure structurally differs from the second phononic crystal structure include the following cases. A plurality of cases may be used in combination.

The period P of the arrangement of the first through holes 43 differs from the period P of the arrangement of the second through holes 45.

The diameter D of the first through holes 43 differs from the diameter D of the second through holes 45.

The type of unit cell 91 including first through holes 43 differs from the type of unit cell 91 including second through holes 45.

As shown in a phononic crystal structure A described later, the arrangement of the first through holes 43 in the first phononic crystal structure and the arrangement of the second through holes 45 in the second phononic crystal structure are not always constant over the entire phononic crystal layers. In consideration of the above, when the first phononic crystal structure structurally differs from the second phononic crystal structure, the p-type thermoelectric converter 22 can have configurations described below. The p-type thermoelectric converter 22 may have a configuration obtained by combining any of the configurations described below.

Configuration A: The first phononic crystal structure includes a domain A that is a phononic crystal region. The second phononic crystal structure includes a domain B that is a phononic crystal region. The domain A and the domain B overlap with each other when viewed in the through direction of the first through holes 43 and the second through holes 45. The period P of the arrangement of the first through holes 43 in the domain A differs from the period of the arrangement of the second through holes 45 in the domain B.

Configuration B: The first phononic crystal structure includes a domain A that is a phononic crystal region. The second phononic crystal structure includes a domain B that is a phononic crystal region. The domain A and the domain B overlap with each other when viewed in the through direction of the first through holes 43 and the second through holes 45. The diameter of the first through holes 43 in the domain A differs from the diameter of the second through holes 45 in the domain B.

Configuration C: The first phononic crystal structure includes a domain A that is a phononic crystal region. The second phononic crystal structure includes a domain B that is a phononic crystal region. The domain A and the domain B overlap with each other when viewed in the through direction of first through holes 43 and the second through holes 45. The type of unit cell including first through holes 43 in the domain A differs from the type of unit cell including second through holes 45 in the domain B.

Each of the domains, which are phononic crystal regions, is a region having an area of, for example, equal to or more than $25P^2$ in plan view, where P is the period of the arrangement of the through holes 43 or 45. To control the dispersion relation of phonons using the phononic crystal structure, the domain may have an area of at least equal to or more than $25P^2$. When the length of the sides of a square domain in plan view is equal to or more than 5×P, the area of the domain can be equal to or more than $25P^2$.

No limitation is imposed on the shape of each domain in plan view. The shape of each domain in plan view is, for example, a polygonal shape such as a triangular, square, or rectangular shape, a circular shape, an elliptical shape, or a combination thereof. Each domain may have an irregular shape in plan view. No limitation is imposed on the number of domains included in each phononic crystal structure. No limitation is imposed on the size of each domain included in the phononic crystal structure. One domain may be spread over the entire phononic crystal layer. The term "in plan view" as used herein means that the phononic crystal layer is viewed in the through direction of the through holes.

The period P of the arrangement of the through holes 43 or 45 is, for example, equal to or more than 1 nm and equal to or less than 300 nm. This is because the wavelength of phonons carrying heat ranges mainly from 1 nm to 300 nm. The period P is determined by the center-to-center distance between adjacent through holes 43 or 45 in plan view.

The diameter D of the through holes 43 or 45 satisfies, for example, $D/P \geq 0.5$, where D/P is the ratio of the diameter D to the period P. If the ratio $D/P < 0.5$, the porosity of the phononic crystal structure is excessively small, so that the heat flow may not be controlled sufficiently, e.g., the thermal conductivity may not be sufficiently reduced. The upper limit of the ratio D/P is, for example, less than 0.9 in order to prevent contact between adjacent through holes 43 or 45. The diameter D of the through holes 43 or 45 is the diameter of their openings. When the openings of the through holes 43 or 45 have a circular shape in plan view, the diameter D is the diameter of the circular shape. The openings of the through holes 43 or 45 may have a non-circular shape in plan view. In this case, the diameter D is defined as the diameter of a virtual circle having the same area as the area of the openings.

Figure 6A:
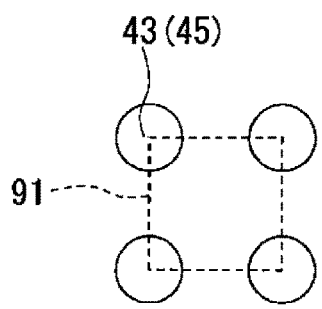
FIG. 6A is a schematic illustration showing an example of a unit cell of a phononic crystal structure that the thermoelectric conversion element can have.
Figure 6B:
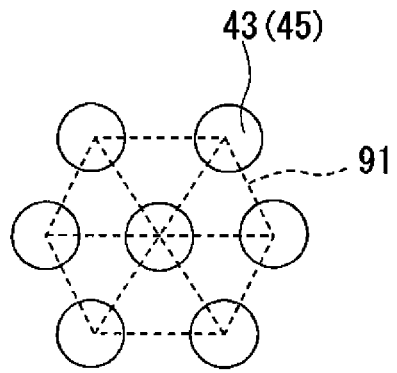
FIG. 6B is a schematic illustration showing another example of the unit cell of the phononic crystal structure that the thermoelectric conversion element can have.
Figure 6C:
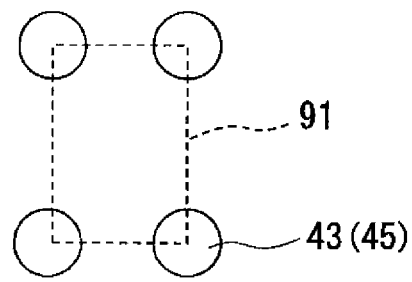
FIG. 6C is a schematic illustration showing yet another example of the unit cell of the phononic crystal structure that the thermoelectric conversion element can have.
Figure 6D:
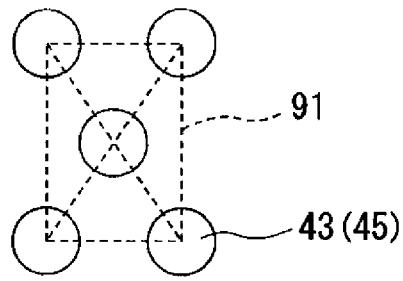
FIG. 6D is a schematic illustration showing still another example of the unit cell of the phononic crystal structure that the thermoelectric conversion element can have.

Examples of the type of unit cell 91 including a plurality of regularly arranged through holes 43 or 45 include a square lattice (FIG. 6A), a hexagonal lattice (FIG. 6B), a rectangular lattice (FIG. 6C), and a centered rectangular lattice (FIG. 6D). However, the type of unit cell 91 is not limited to these examples.

The material M forming the p-type thermoelectric converter 22, the n-type thermoelectric converter 23, and the phononic crystal layers that the p-type thermoelectric converter 22 and the n-type thermoelectric converter 23 can have is typically a semiconductor material doped with an impurity element such that the material is of an appropriate semiconductor type such as the p or n type. The semiconductor material is, for example, silicon (Si), Ge, SiGe, SiC, ZnSe, CdSn, ZnO, GaAs, InP, or GaN. The material M may be a material other than the semiconductor materials, and such a material is, for example, TiN, SiN, or $VO_2$. However, the material M is not limited to the above examples.

Among semiconductor materials, a Si-based semiconductor material generally has a relatively high thermal conductivity. Therefore, in a conventional thermoelectric conversion element including thermoelectric converters formed of a Si-based semiconductor material, it is difficult to obtain high thermoelectric conversion efficiency. However, in the thermoelectric conversion element 21, the thermoelectric converters each have a phononic crystal layer. Therefore, in the thermoelectric conversion elements 21 and the thermoelectric conversion device 1 including the thermoelectric conversion elements 21, high thermoelectric conversion efficiency can be obtained even when the thermoelectric converters are formed of a Si-based semiconductor material.

The following advantages, for example, are obtained when the thermoelectric converters can be formed of a Si-based semiconductor material. The substrate 6 may be used as a base substrate.

The thermoelectric conversion elements and a thermoelectric conversion device including these elements can be formed on a base substrate formed of a Si-based semiconductor material such as a Si wafer.

The thermoelectric conversion elements and the thermoelectric conversion device can be embedded in a base substrate formed of a Si-based semiconductor material. In this case, for example, an integrated circuit such as a CPU or GPU can be formed on the base substrate in which the thermoelectric conversion elements or the thermoelectric conversion device is embedded. This means, for example, that an electronic device such as an integrated circuit device in which a Peltier-type cooling device is embedded can be produced. The integrated circuit device may be a semiconductor element including a thermoelectric conversion device and an integrated circuit integrated together and housed in one package.

The first phononic crystal structure and the second phononic crystal structure may have the following configuration. Each phononic crystal structure includes a first domain and a second domain that are phononic crystal regions. The first domain has a plurality of through holes regularly arranged in a first direction in a cross section perpendicular to the through direction of the through holes. The second domain has a plurality of through holes regularly arranged in a second direction different from the first direction in a cross section perpendicular to the through direction of the through holes. Such a phononic crystal structure having a plurality of domains distinguished by their arrangement orientation is hereinafter referred to as a phononic crystal structure A. The arrangement orientation can be determined by the orientation of the unit cell.

According to studies by the present inventors, the degree of reduction in thermal conductivity obtained by a phononic crystal structure depends on the angle between the direction of heat transfer and the orientation of the unit cell of the phononic crystal structure. This may be because factors relating to heat conduction such as the number of PBGs, the band width of each PBG, the average group velocity of phonons depend on the above angle. As for heat transfer, phonons flow in a direction from a high temperature side to a low temperature side in a macroscopic sense. When attention is focused on micro-regions of the order of nanometers, the flow of phonons has no directivity. Specifically, phonons do not flow in a uniform direction in a microscopic sense.

The above-described Patent Literature and Non Patent Literature disclose members each having a plurality of phononic crystal regions with the same unit cell orientation. In these members, their interaction with phonons flowing in a specific direction is maximized in a microscopic sense, but the interaction with phonons flowing in the other directions is weakened. The phononic crystal structure A includes two or more phononic crystal regions with different unit cell directions. Therefore, the interaction with phonons flowing in a plurality of directions can be enhanced in a microscopic sense. This feature allows the degree of flexibility in controlling the heat flow to be further improved.

The following description relates to the phononic crystal structure A that at least one phononic crystal layer selected from the first phononic crystal layer 44 and the second phononic crystal layer 46 can have. When a plurality of phononic crystal layers have their respective phononic crystal structures A, these phononic crystal structures A may be structurally the same as or different from each other.

Figure 7:
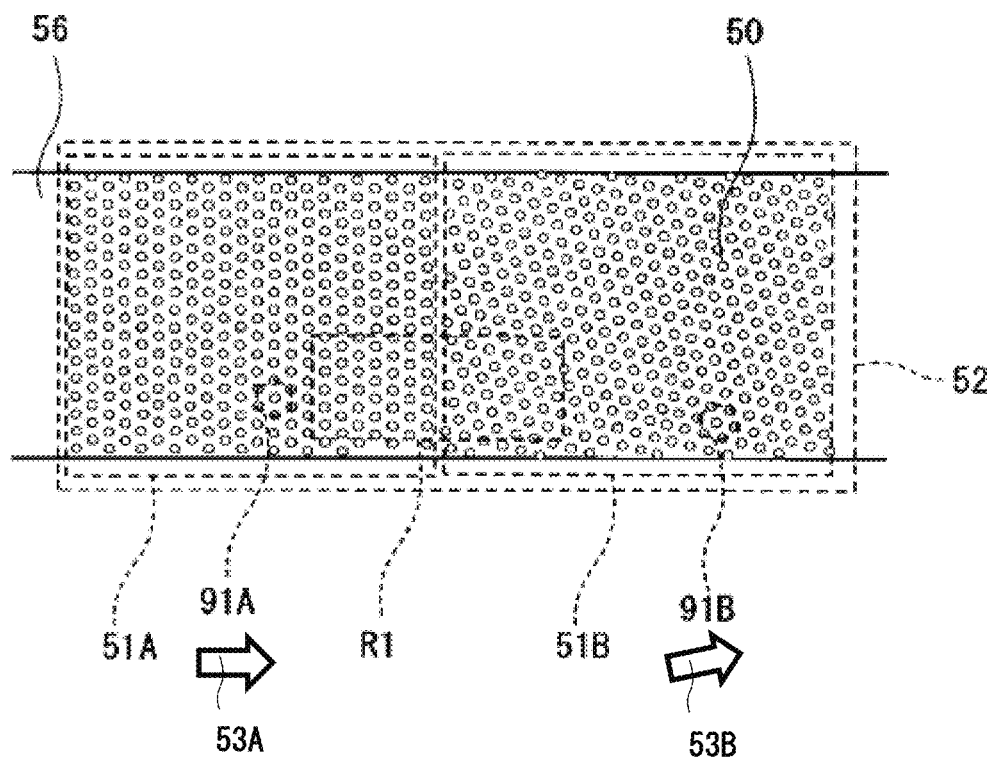
FIG. 7 is a plan view schematically showing an example of the phononic crystal structure that the thermoelectric conversion element can have.

An example of the phononic crystal structure A is shown in FIG. 7. FIG. 7 shows a plan view of part of a phononic crystal layer 56. The phononic crystal layer 56 may be at least one phononic crystal layer selected from the first phononic crystal layer 44 and the second phononic crystal layer 46. The phononic crystal layer 56 is a thin film having a thickness of, for example, equal to or larger than 10 nm and equal to or less than 500 nm. The phononic crystal layer 56 is rectangular in plan view. A plurality of through holes 50 extending in the thickness direction of the phononic crystal layer 56 are provided in the phononic crystal layer 56. The phononic crystal structure A that the phononic crystal layer 56 has is a two-dimensional phononic crystal structure in which the plurality of through holes 50 are regularly arranged in in-plane directions.

The phononic crystal structure A includes the first domain 51A and the second domain 51B that are phononic crystal regions. The first domain 51A has a phononic single crystal structure including a plurality of through holes 50 arranged regularly in a first direction in plan view. The second domain 51B has a phononic single crystal structure including a plurality of through holes 50 arranged regularly in a second direction different from the first direction in plan view. In each of the single crystal structures, the plurality of through holes 50 have the same diameter and arranged with the same period. In each of the single crystal structures, the orientations of unit cells 91A or 91B of the plurality of regularly arranged through holes 50 are the same as each other. The first domain 51A and the second domain 51B each have a rectangular shape in plan view. The shape of the first domain 51A and the shape of the second domain 51B are the same in plan view. The phononic crystal structure A is also a phononic polycrystal structure 52 that is a complex body including a plurality of phononic single crystal structures.

Figure 8A:
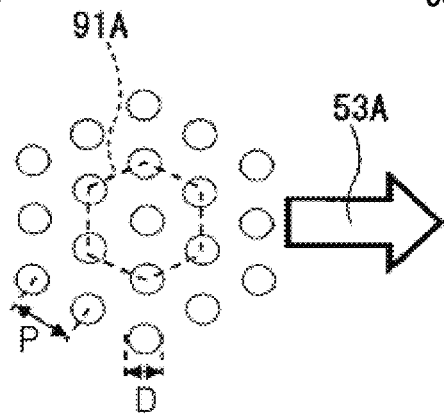
FIG. 8A is a schematic illustration showing a unit cell of a first domain included in the phononic crystal structure in FIG. 7 and the orientation of the unit cell.
Figure 8B:
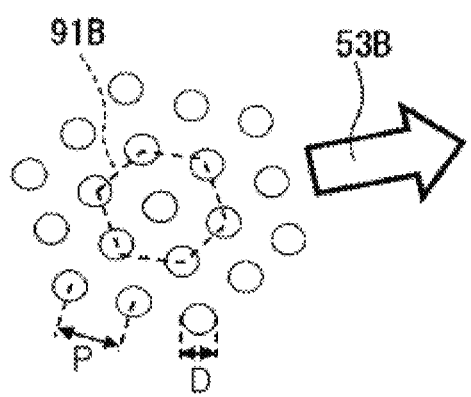
FIG. 8B is a schematic illustration showing a unit cell of a second domain included in the phononic crystal structure in FIG. 7 and the orientation of the unit cell.

As shown in FIGS. 8A and 8B, in the phononic crystal structure A, the orientation 53A of each unit cell 91A in the first domain 51A differs from the orientation 53B of each unit cell 91B in the second domain 51B in plan view. The angle between the orientation 53A and the orientation 53B in plan view is, for example, equal to or more than 10 degrees. When the unit cell 91A and the unit cell 91B are identical and have an n-fold rotational symmetry, the upper limit of the angle between the orientation 53A and the orientation 53B is less than 360/n degrees. When each unit cell has n-fold symmetries for a plurality of n's, the largest one of the n's is used to determine the upper limit of the angle.

For example, a hexagonal lattice has a 2-fold rotational symmetry, a 3-fold rotational symmetry, and a 6-fold rotational symmetry. In this case, "6" is used for the n defining the upper limit of the angle. Specifically, when the unit cells 91A and 91B are each a hexagonal lattice, the angle between the orientation 53A and the orientation 53B is less than 60 degrees. The phononic crystal structure A includes at least two phononic crystal regions having different unit cell orientations. The phononic crystal structure A may further include any other phononic crystal regions and/or regions having no phononic crystal structure so long as the above condition is met.

The orientation of a unit cell can be determined based on any rule. However, it is necessary that the same rule be applied to different domains to determine the orientations of their unit cells. The orientation of a unit cell is, for example, the extending direction of a straight line bisecting the angle between two non-parallel sides included in the unit cell. However, it is necessary to use the same rule for different domains to define their two sides.

Figure 9:
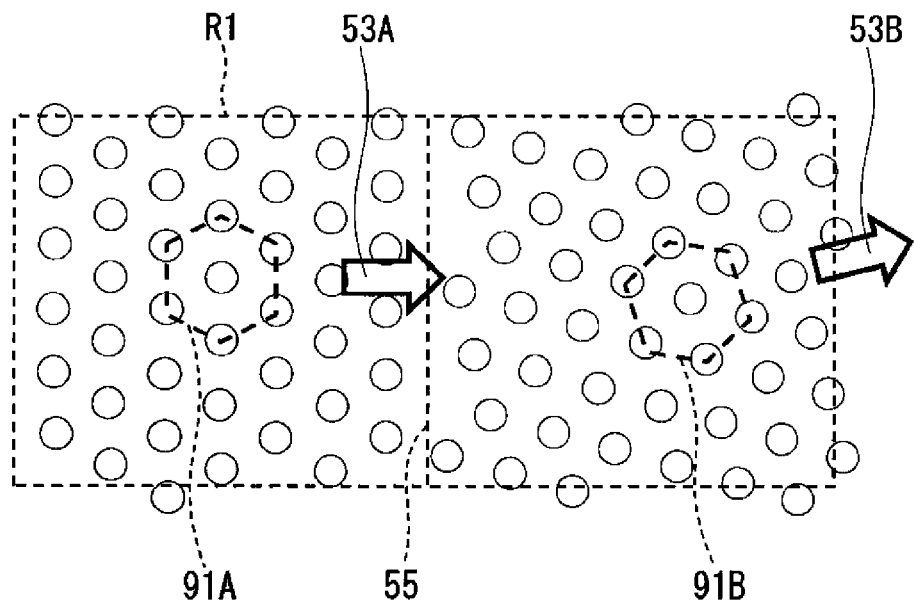
FIG. 9 is an enlarged view of region R1 in the phononic crystal structure in FIG. 7.

FIG. 9 shows an enlarged view of region R1 in the phononic crystal structure A in FIG. 7. The orientations 53A and 53B of the unit cells 91A and 91B change at the interface 55 between the first domain 51A and the second domain 51B adjacent to each other. The interface 55 at which the orientations of the unit cells change has a large interface resistance to heat macroscopically flowing through the phononic crystal structure A. The interface resistance is based on a mismatch between the group velocity of phonons in the first domain 51A and the group velocity of phonons in the second domain 51B. The interface resistance contributes to a reduction in the thermal conductivity of the phononic crystal layer 56 having the phononic crystal structure A. In FIG. 9, the interface 55 extends linearly in plan view. The interface 55 extends in the width direction of the rectangular phononic crystal layer 56 in plan view. The width direction may be a direction perpendicular to the extending direction of the centerline of the phononic crystal layer 56 that is determined by the direction of macroscopic heat transfer. The interface 55 divides the phononic crystal structure A in a direction substantially perpendicular to the direction of macroscopic heat transfer in plan view.

In the phononic crystal structure A in FIG. 7, the period P of the arrangement of the plurality of through holes 50 in the first domain 51A is the same as the period P of the arrangement of the plurality of through holes 50 in the second domain 51B.

In the phononic crystal structure A in FIG. 7, the diameter of the plurality of through holes 50 regularly arranged in the first domain 51A is the same as the diameter of the plurality of through holes 50 regularly arranged in the second domain 51B.

In the phononic crystal structure A in FIG. 7, the type of unit cell 91A in the first domain 51A is the same as the type of unit cell 91B in the second domain 51B. The unit cell 91A and the unit cell 91B in FIG. 7 are each a hexagonal lattice.

No limitation is imposed on the number of domains included in the phononic crystal structure A. The larger the number of domains included in the phononic crystal structure A is, the larger the effect of the interface resistance at the interfaces between domains is.

Other examples of the phononic crystal structure A will be shown.

Figure 10:
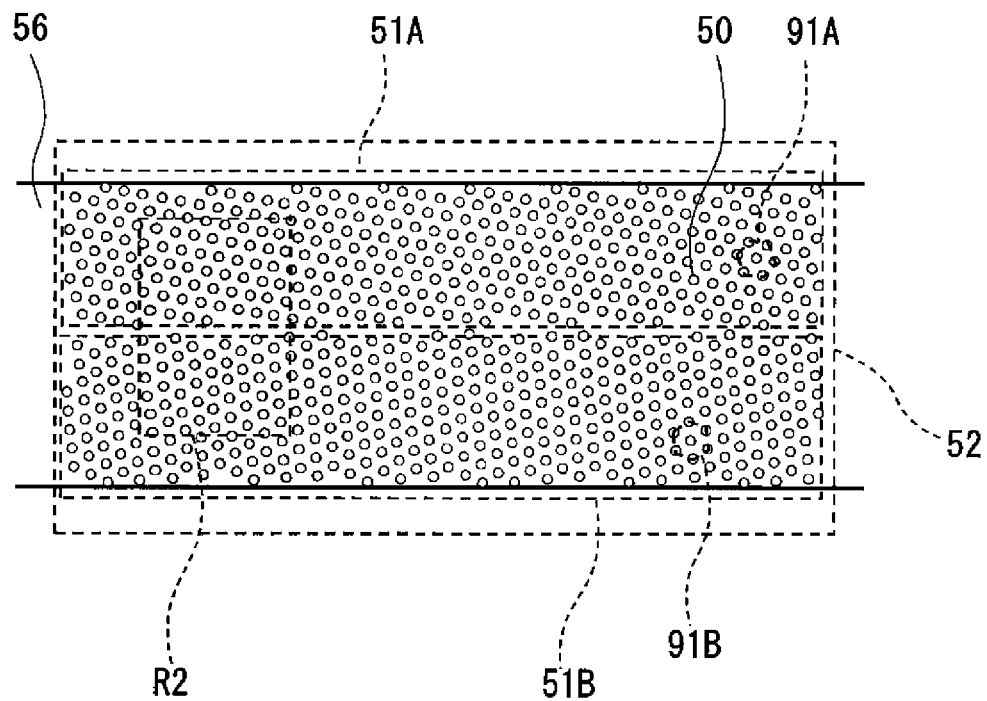
FIG. 10 is a plan view schematically showing another example of the phononic crystal structure that the thermoelectric conversion element can have.
Figure 11:
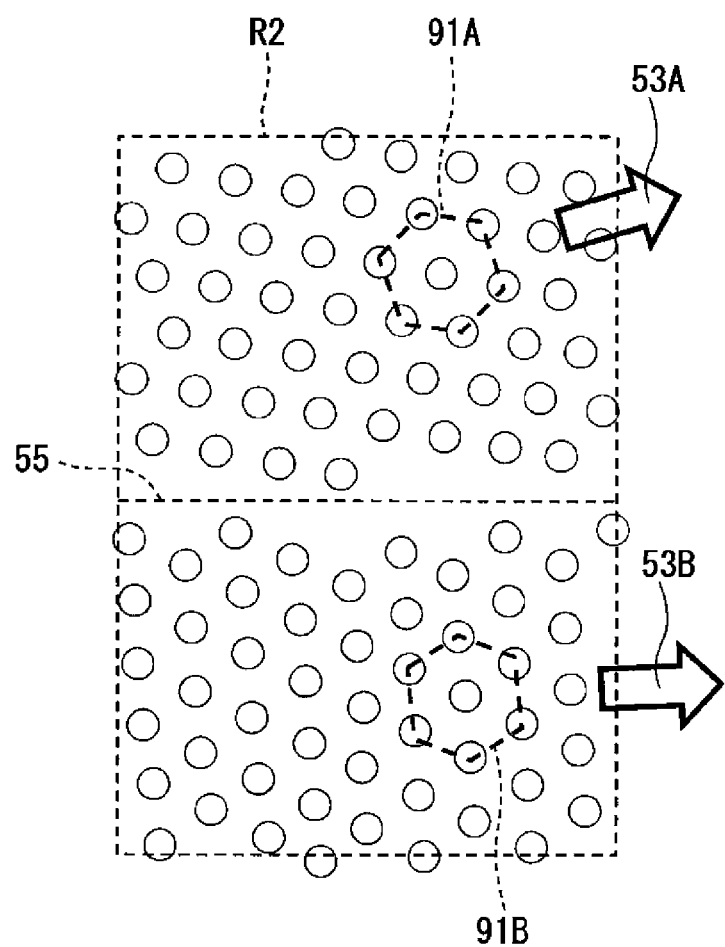
FIG. 11 is enlarged view of region R2 in the phononic crystal structure in FIG. 10.

In a polycrystal structure 52 that is a phononic crystal structure A in FIGS. 10 and 11, the interface 55 between a first domain 51A and a second domain 51B adjacent to each other extends in the direction of the long sides of the rectangular phononic crystal layer 56 in plan view. The phononic crystal structure A in FIGS. 10 and 11 is structurally the same as the phononic crystal structure A in FIG. 7 except for the above feature. FIG. 11 is an enlarged view of region R2 in FIG. 10.

In the phononic crystal structures A in FIGS. 7 and 10, the size of the first domain 51A is the same as the size of the second domain 51B in plan view. However, the sizes of the first and second domains 51A and 51B included in a phononic structure A may differ from each other in plan view.

Figure 12:
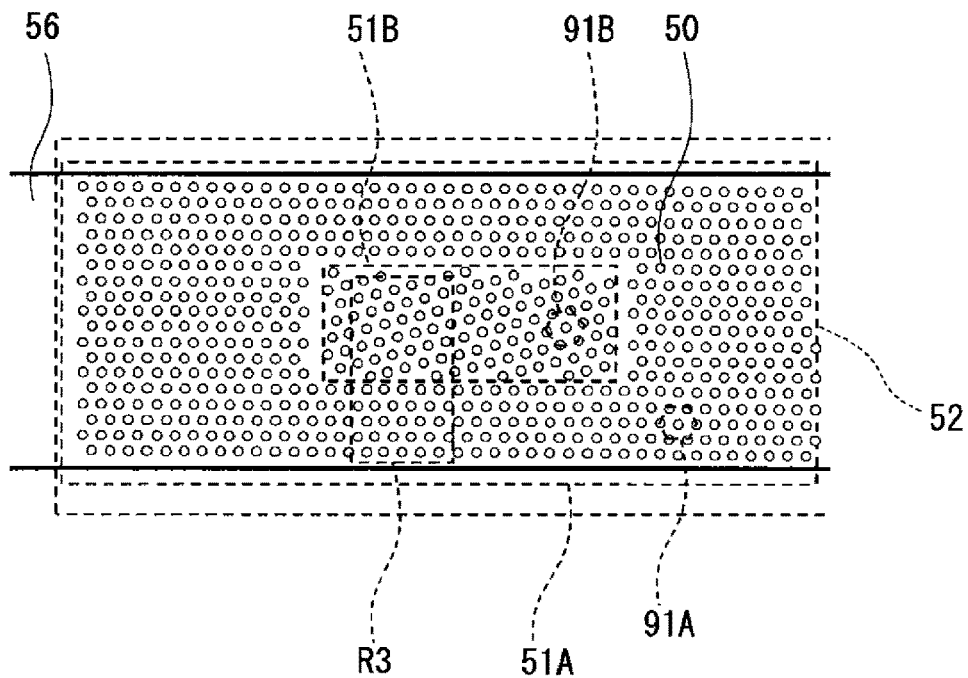
FIG. 12 is a plan view schematically showing yet another example of the phononic crystal structure that the thermoelectric conversion element can have.
Figure 13:
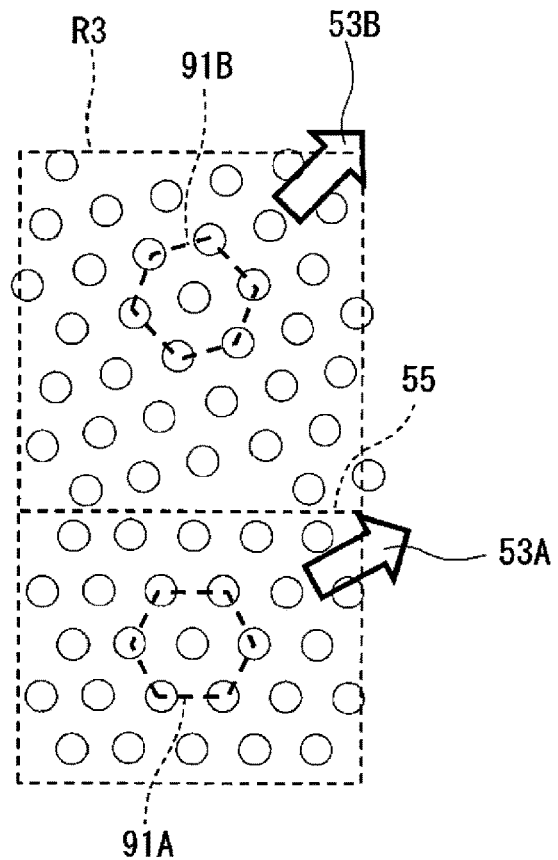
FIG. 13 is an enlarged view of region R3 in the phononic crystal structure in FIG. 12.

In a polycrystal structure 52 that is a phononic crystal structure A in FIGS. 12 and 13, a first domain 51B is surrounded by a second domain 51A in plan view. The first domain 51A has a rectangular outer shape in plan view. The second domain 51B has a rectangular shape in plan view. The size of the first domain 51A differs from the size of the second domain 51B in plan view. In plan view, the interface 55 between the second domain 51B and the first domain 51A surrounding the second domain 51B forms the outer edge of the second domain 51B. The phononic crystal structure A in FIGS. 12 and 13 is structurally the same as the phononic crystal structure A in FIG. 7 except for the above feature. FIG. 13 is an enlarged view of region R3 in FIG. 12.

In the phononic crystal structure A in FIGS. 12 and 13, the interface 55 has bent portions.

Moreover, the phononic crystal structure A in FIGS. 12 and 13 includes the second domain 51B that is not in contact with the sides of the phononic crystal layer 56.

Figure 14:
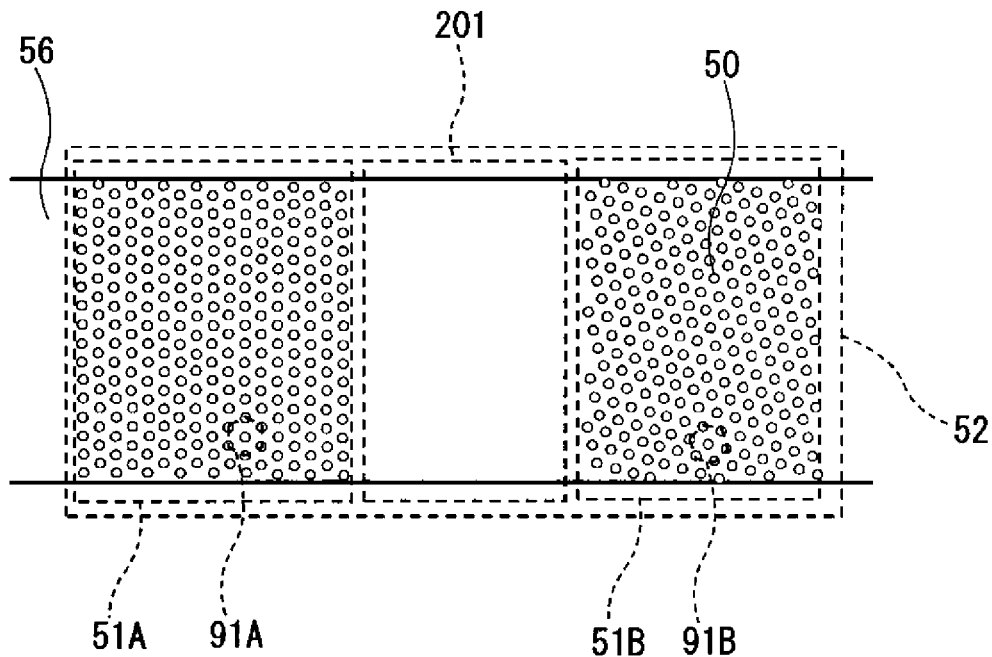
FIG. 14 is a plan view schematically showing still another example of the phononic crystal structure that the thermoelectric conversion element can have.

In a polycrystal structure 52 that is a phononic crystal structure A in FIG. 14, a first domain 51A and a second domain 51B are disposed so as to be spaced apart from each other in plan view. More specifically, in plan view, a region 201 having no through holes 50 is disposed between the first domain 51A and the second domain 51B so as to extend in the long side direction of the phononic crystal layer 56. The phononic crystal structure A in FIG. 14 is structurally the same as the phononic crystal structure A in FIG. 7 except for the above feature.

Figure 15:
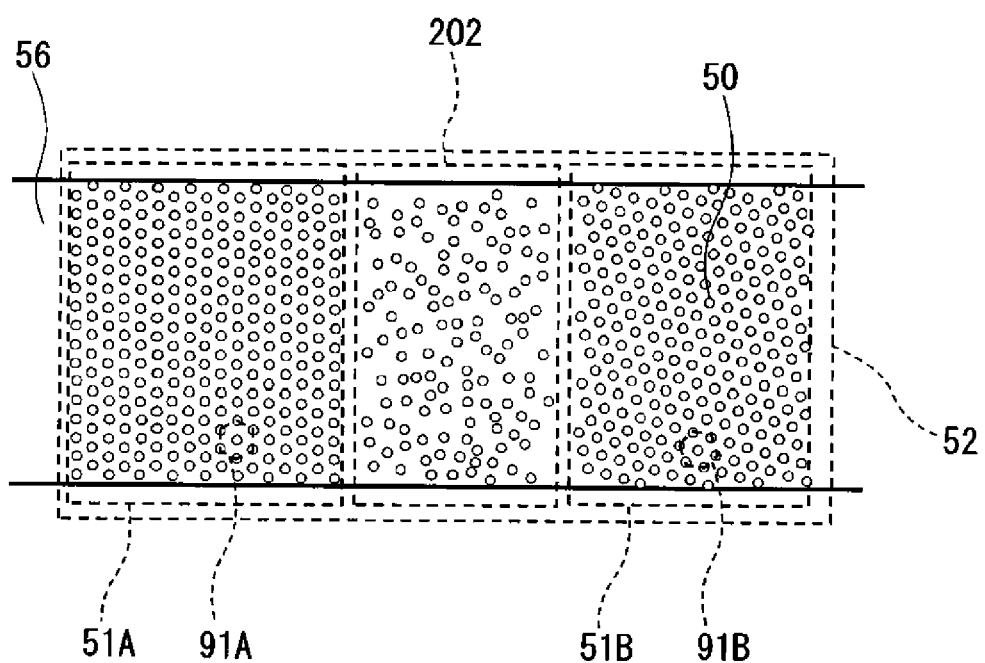
FIG. 15 is a plan view schematically showing even another example of the phononic crystal structure that the thermoelectric conversion element can have.

In a polycrystal structure 52 that is a phononic crystal structure A in FIG. 15, a first domain 51A and a second domain 51B are disposed so as to be spaced apart from each other in plan view. More specifically, in plan view, a region 202 having randomly arranged through holes 50 is disposed between the first domain 51A and the second domain 51B so as to extend in the long side direction of the phononic crystal layer 56. In the region 202, the through holes 50 are not arranged regularly in plan view. Alternatively, in the region 202, the area of a regular arrangement region is, for example, less than $25P^2$ in plan view. Here, P is the period of the arrangement of the through holes 50. The phononic crystal structure A in FIG. 15 is structurally the same as the phononic crystal structure A in FIG. 7 except for the above feature.

Figure 16:
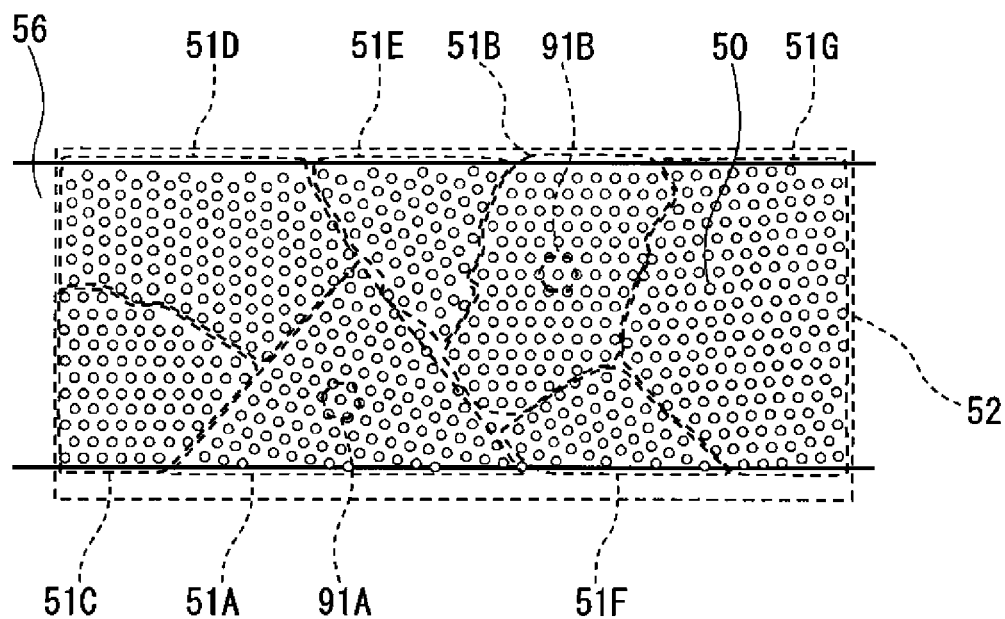
FIG. 16 is a plan view schematically showing even another example of the phononic crystal structure that the thermoelectric conversion element can have.

A polycrystal structure 52 that is a phononic crystal structure A in FIG. 16 includes a plurality of domains 51A, 51B, 51C, 51D, 51E, 51F, and 51G having different shapes in plan view. In each of the domains, the period of the arrangement of a plurality of through holes 50 and the unit cell orientation are constant. However, the unit cell orientations of the domains differ from each other. In plan view, the sizes and shapes of the domains differ from each other. In this configuration, the number of unit cell orientations in the phononic crystal structure A as a whole is larger than that in the configurations exemplified above. Therefore, the effect of reducing the thermal conductivity that is based on the difference in unit cell orientation is more significant. In this configuration, interfaces 55 between the domains extend in a plurality of random directions in plan view. Therefore, the effect of reducing the thermal conductivity based on the interface resistance is more significant.

In the phononic crystal structure A in FIG. 16, the interface 55 between the first domain 51A and the second domain 51B adjacent to each other extends in a direction inclined with respect to the width direction of the phononic crystal layer 56 in plan view. The interfaces 55 also have bent portions in plan view.

Figure 17A:
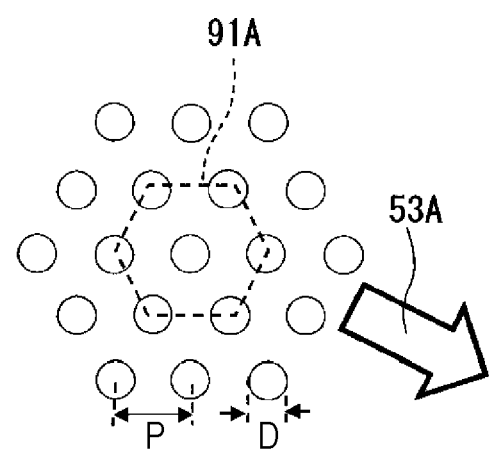
FIG. 17A is a schematic illustration showing an example of the unit cell of the phononic crystal structure that the thermoelectric conversion element can have.
Figure 17B:
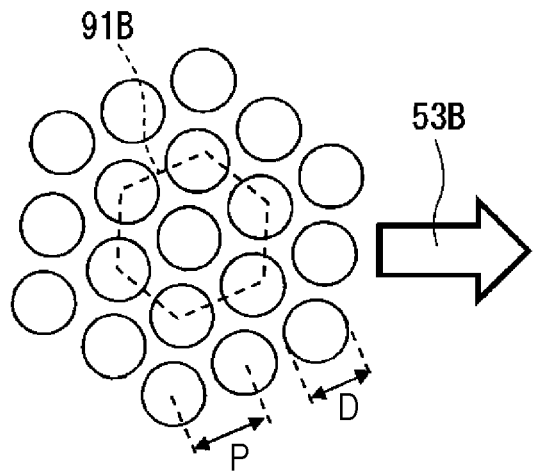
FIG. 17B is a schematic illustration showing another example of the unit cell of the phononic crystal structure that the thermoelectric conversion element can have.

A polycrystal structure 52 that is a phononic crystal structure A may include a first domain 51A and a second domain 51B that differ in the period P of the arrangement of through holes 50 and/or in the diameter D of the through holes 50. The diameter D of through holes 50 in a first domain 51A shown in FIG. 17A differs from the diameter D of through holes 50 in a second domain 51B shown in FIG. 17B. The period P of the arrangement of the through holes 50 in the first domain 51A shown in FIG. 17A is the same as the period P of the arrangement of the through holes 50 in the second domain 51B shown in FIG. 17B.

Figure 18:
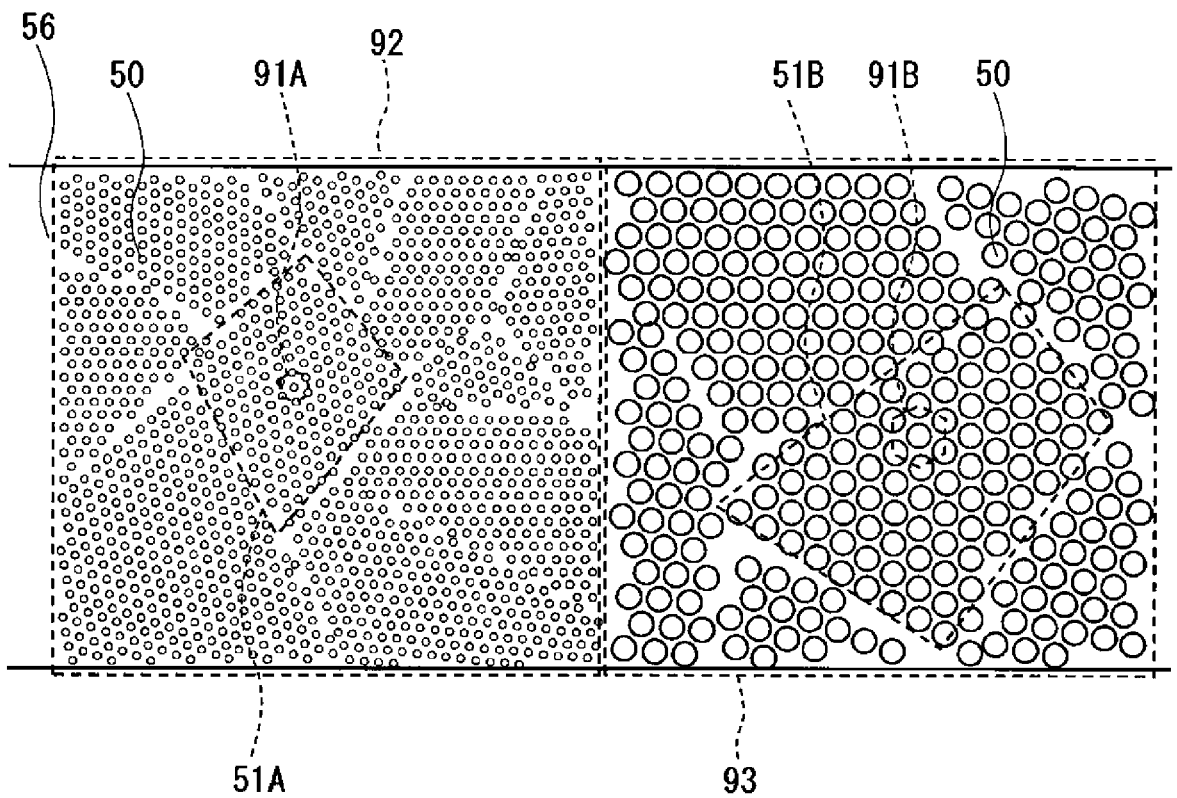
FIG. 18 is a plan view schematically showing even another example of the phononic crystal structure that the thermoelectric conversion element can have.

A phononic crystal structure A shown in FIG. 18 has a first domain 51A in which a plurality of through holes 50 having a smaller diameter D are regularly arranged with a smaller period P and a second domain 51B in which a plurality of through holes 50 having a larger diameter D are regularly arranged with a larger period P. The phononic crystal structure A shown in FIG. 18 includes a region 92 including a plurality of through holes 50 with a smaller period P and a smaller diameter D and a region 93 including a plurality of through holes 50 with a larger period P and a larger diameter D. The region 92 is adjacent to the region 93. The region 92 and the region 93 each include a plurality of domains having different shapes and different unit cell orientations in plan view, as in the example shown in FIG. 16. The region 92 and the region 93 divide the phononic crystal structure A in a direction substantially parallel to the direction of macroscopic heat transfer. In this configuration, the frequency band of a PBG formed in the first domain 51A differs from the frequency band of a PBG formed in the second domain 51B, and therefore, the effect of reducing the thermal conductivity is particularly significant.

Figure 19:
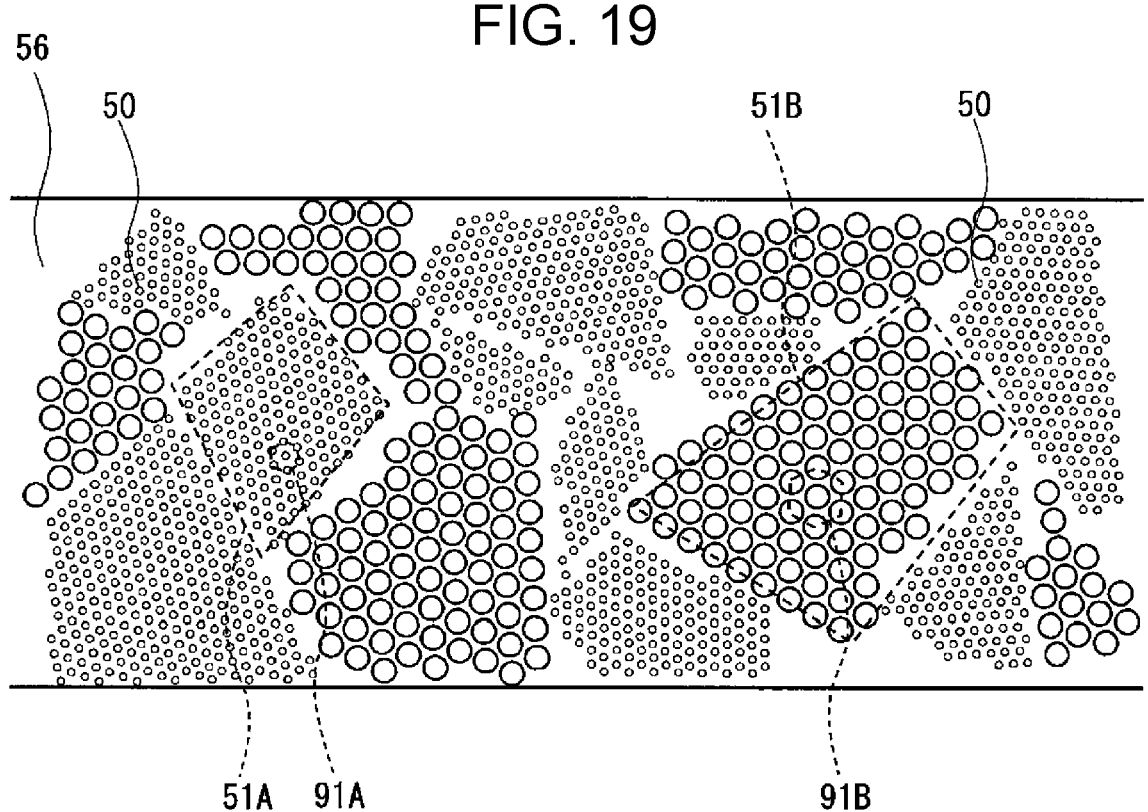
FIG. 19 is a plan view schematically showing even another example of the phononic crystal structure that the thermoelectric conversion element can have.

A phononic crystal structure A shown in FIG. 19 includes a first domain 51A in which a plurality of through holes 50 having a smaller diameter D are regularly arranged with a smaller period P and a second domain 51B in which a plurality of through holes 50 having a larger diameter D are regularly arranged with a larger period P. The phononic crystal structure A in FIG. 19 includes a plurality of domains having different shapes in plan view and different unit cell orientations. In this configuration, the frequency band of a PBG formed in the first domain 51A differs from the frequency band of a PBG formed in the second domain 51B, and therefore the effect of reducing the thermal conductivity is particularly significant.

The phononic crystal layer 56 has, for example, a polygonal shape such as a triangular, square, or rectangular shape, a circular shape, an elliptical shape, or a combination thereof in plan view. However, the shape of the phononic crystal layer 56 is not limited to the above examples.

The thermoelectric converter has, for example, a polygonal shape such as a triangular, square, or rectangular shape, a circular shape, an elliptical shape, or a combination thereof in plan view. However, the shape of the thermoelectric converter is not limited to the above examples. The thermoelectric converter may have a rectangular parallelepipedic or cubic shape.

The thermoelectric converter may include two or more first phononic crystal layers 44 and/or two or more second phononic crystal layers 46. The thermoelectric converter may further include a phononic crystal layer having a phononic crystal structure having a configuration different from those of the first phononic crystal structure and the second phononic crystal structure.

Figure 20A:
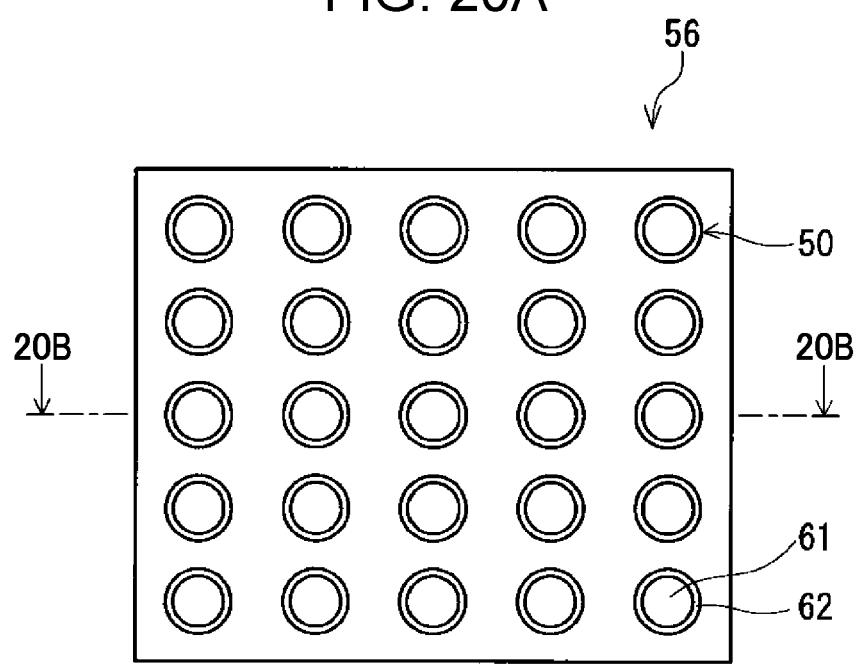
FIG. 20A is a plan view schematically showing an example of the phononic crystal layer that the thermoelectric conversion element can have.
Figure 20B:
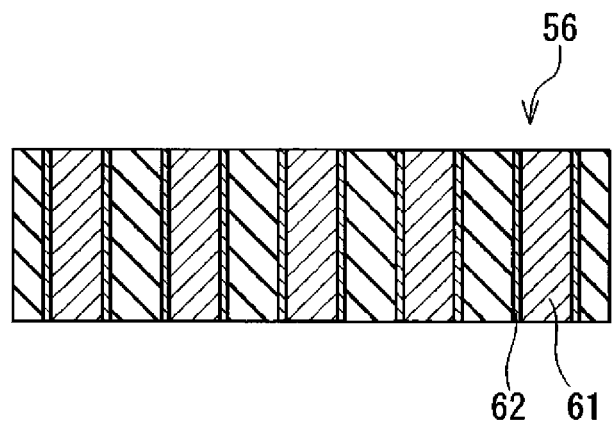
FIG. 20B is a cross-sectional view showing a cross section 20B-20B of the phononic crystal layer in FIG. 20A.

Another example of the phononic crystal layer 56 is shown in FIGS. 20A and 20B. FIG. 20B shows a cross section 20B-20B of the phononic crystal layer 56 in FIG. 20A. The phononic crystal layer 56 shown in FIGS. 20A and 20B further includes a plurality of pillars 61. The pillars 61 are columnar members extending linearly. Each of the pillars 61 is filled into a corresponding one of the through holes 50 in the phononic crystal layer 56. The circumferential surface of each of the pillars 61 is covered with an oxide film 62. In this configuration, the through holes 50 that are vacant holes are filled with the respective pillars 61. Therefore, for example, the degree of flexibility in controlling the characteristics of the phononic crystal layer 56 in the through direction of the through holes 50 can be increased. More specifically, for example, in a thermoelectric converter that is a stacked structural body including two or more phononic crystal layers 56, the electron conductivity between a first end 41 and a second end 42 can be improved while the low thermal conductivity based on the phononic crystal structures is maintained.

When the material the phononic crystal layer 56 into which the pillars 61 have been filled is the same as the material of the pillars 61, the circumferential surface of each of the pillars 61 is covered with the oxide film 62. When the material the phononic crystal layer 56 into which the pillars 61 have been filled is different from the material of the pillars 61, the oxide film 62 is not always necessary.

The phononic crystal layer 56 further including the pillars 61 is, for example, the first phononic crystal layer 44 and/or the second phononic crystal layer 46. The pillars 61 may be filled into the first through holes 43 and also into the second through holes 45.

Typically, the pillars 61 are formed of a semiconductor material. The material forming the pillars 61 is, for example, Si, SiGe, SiC, TiN, SiN, or $VO_2$. However, the material forming the pillars 61 is not limited to the above examples.

The oxide film 62 is, for example, a $SiO_2$ film. However, the oxide film 62 is not limited to the above example.

Figure 21:
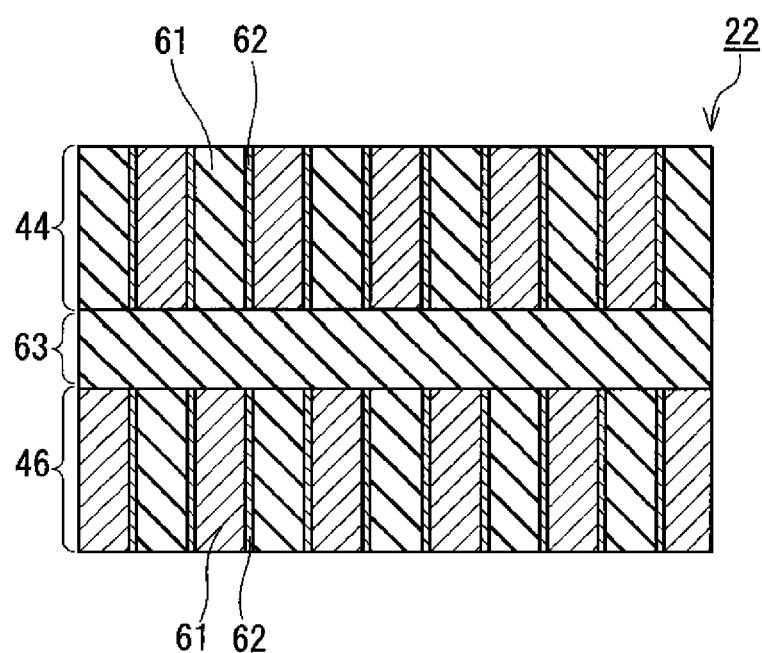
FIG. 21 is a cross-sectional view schematically showing another example of the thermoelectric converter in the thermoelectric conversion element that the thermoelectric conversion device of the present disclosure can have.

FIG. 21 shows an example of the p-type thermoelectric converter 22 including the first phononic crystal layer 44 and the second phononic crystal layer 46 with the pillars 61 filled thereinto. The p-type thermoelectric converter 22 in FIG. 21 includes the phononic crystal layers 56 shown in FIGS. 20A and 20B as the first phononic crystal layer 44 and the second phononic crystal layer 46. The p-type thermoelectric converter 22 in FIG. 21 is a two-layer structural body including two phononic crystal layers 56. A buffer layer 63 is disposed between the first phononic crystal layer 44 and the second phononic crystal layer 46. The material forming the pillars 61 (excluding the oxide film 62) in the first phononic crystal layer 44 is the same as the material forming the buffer layer 63. The material forming the buffer layer 63 is the same as the material forming the second phononic crystal layer 46 (excluding the pillars 61 and the oxide film 62).

Figure 22A:
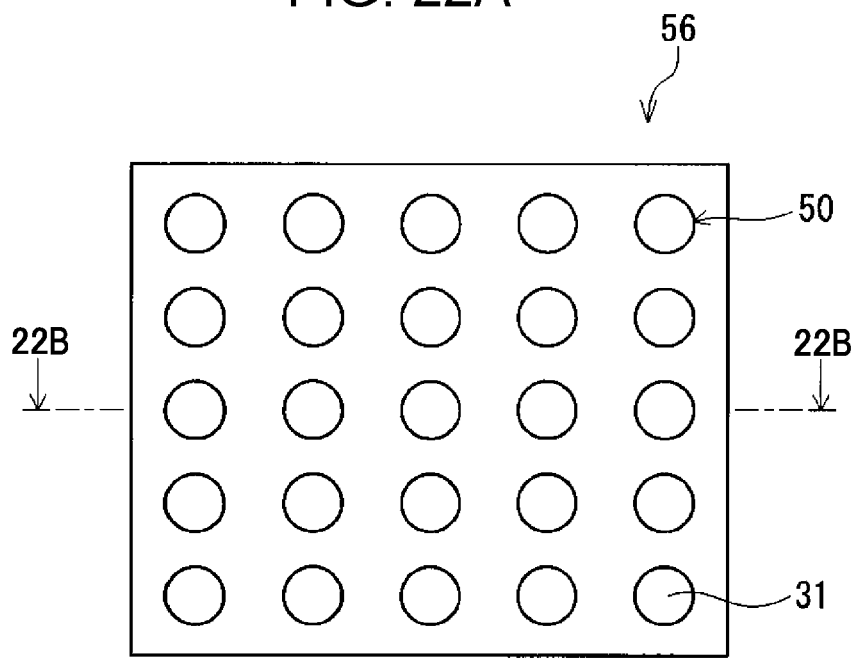
FIG. 22A is a plan view schematically showing another example of the phononic crystal layer that the thermoelectric conversion element can have.
Figure 22B:
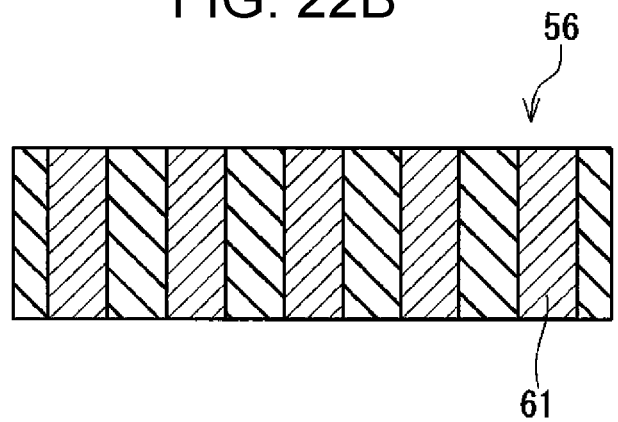
FIG. 22B is a cross-sectional view showing a cross section 22B-22B of the phononic crystal layer in FIG. 22A.

Another example of the phononic crystal layer 56 is shown in FIGS. 22A and 22B. FIG. 22B shows a cross section 22B-22B of the phononic crystal layer 56 in FIG. 22A. The phononic crystal layer 56 shown in FIGS. 22A and 22B further includes a plurality of pillars 61. Each of the pillars 61 is filled into a corresponding one of the through holes 50 in the phononic crystal layer 56. The material forming the pillars 61 differs from the material forming the phononic crystal layer 56.

Figure 23:
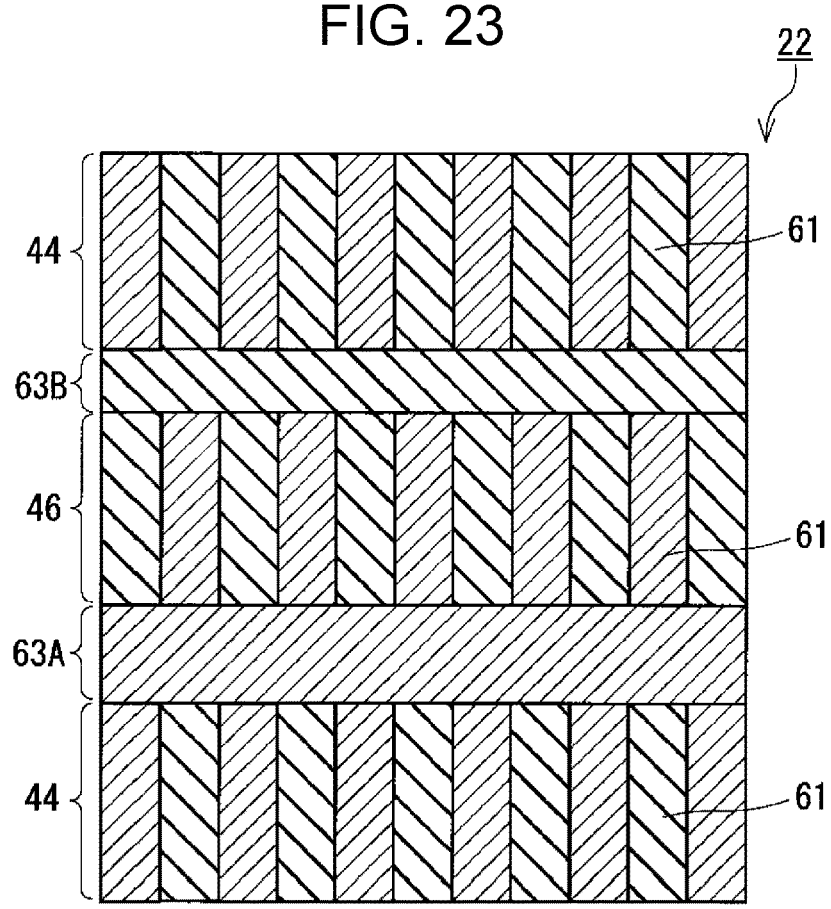
FIG. 23 is a cross-sectional view schematically showing another example of the thermoelectric converter in the thermoelectric conversion element that the thermoelectric conversion device of the present disclosure can have.

FIG. 23 shows an example of the p-type thermoelectric converter 22 including the first phononic crystal layer 44 and the second phononic crystal layer 46 with pillars 61 filled thereinto. The p-type thermoelectric converter 22 in FIG. 23 is a three-layer structural body which includes three phononic crystal layers 56 and in which a first phononic crystal layer 44, a second phononic crystal layer 46, and a first phononic crystal layer 44 are disposed in this order. A first buffer layer 63A is disposed between the lowermost first phononic crystal layer 44 and the second phononic crystal layer 46. A second buffer layer 63B is disposed between the second phononic crystal layer 46 and the uppermost first phononic crystal layer 44. The material forming the pillars 61 in the first phononic crystal layer 44 is the same as the material forming the second buffer layer 63B. The material forming the pillars 61 in the second phononic crystal layer 46 is the same as the material forming the first buffer layer 63A. The material forming the first phononic crystal layers 44 (excluding the pillars 61) is the same as the material forming the first buffer layer 63A. The material forming the second phononic crystal layer 46 (excluding the pillars 61) is the same as the material forming the second buffer layer 63B. The p-type thermoelectric converter 22 in FIG. 23 is formed from two types of materials. The two types of materials may be semiconductor materials.

The first connection electrode 11, the second connection electrode 12, the third connection electrode 13, the fourth connection electrode 14, the first electrodes 24, the second electrodes 25, and the third electrodes 26 are each formed of a conductive material. The conductive material is typically a metal. The metal is, for example, chromium (Cr), aluminum (Al), gold (Au), silver (Ag), or copper (Cu). However, the conductive material is not limited to the above examples. At least one selected from the first connection electrode 11, the second connection electrode 12, the third connection electrode 13, the fourth connection electrode 14, the first electrodes 24, the second electrodes 25, and the third electrodes 26 may include a phononic crystal layer. The through direction of the plurality of through holes in the phononic crystal layer may be substantially parallel to the direction X.

The substrate (base layer) 6 is typically formed of a semiconductor material. The semiconductor material is, for example, Si. The substrate 6 may be a Si wafer. An oxide film may be formed on the upper surface of the substrate 6 formed of Si. The oxide film is, for example, a $SiO_2$ film. The oxide film may be the insulating layer 7. The structure of the substrate 6 is not limited to the above example. For example, an integrated circuit may be embedded in the substrate 6. The substrate 6 may have a multilayer structure including a plurality of stacked layers. At least part of the substrate 6 may include a phononic crystal layer. The through direction of the plurality of through holes in the phononic crystal layer may be substantially parallel to the direction X.

The insulating layer 7 may function as a layer for maintaining electrical insulation between the substrate 6 and the thermoelectric conversion module 2. The insulating layer 7 and the insulating portions 27 are typically formed of an insulating material. The insulating material is, for example, any of oxides, nitrides, and oxynitrides of metals including Si. The insulating material may be $SiO_2$. However, the insulating material is not limited to the above examples. At least one selected from the insulating layer 7 and the insulating portions 27 may include a phononic crystal layer. The through direction of the plurality of through holes in the phononic crystal layer may be substantially parallel to the direction X.

The protective layer 8 may function as a layer that protects the thermoelectric conversion device 1. The protective layer 8 is formed of, for example, an insulating material. The protective layer 8 may be an insulating layer. The thermoelectric conversion module 2 may be a member held between a pair of insulating layers. Examples of the insulating material are as described above. The protective layer 8 may include a phononic crystal layer. The through direction of the plurality of through holes in the phononic crystal layer may be substantially parallel to the direction X.

When a member of each thermoelectric conversion element 21 other than the thermoelectric converters includes a phononic crystal layer, the thermal conductivity of the thermoelectric conversion device 1 in in-plane directions can be further reduced. This reduction allows the thermoelectric conversion efficiency of the thermoelectric conversion device 1 to be further improved. Moreover, the reduction can inhibit the diffusion of heat in the in-plane directions, so that the degree of flexibility in the construction of an electronic device including the thermoelectric conversion device 1 can be increased.

By reducing the thermal conductivity in the in-plane directions, even when, for example, a heat source is disposed in contact with a thermoelectric conversion region A, the temperature of a thermoelectric conversion region B not in contact with the heat source can be maintained low. In an advantageous form, the temperature of the thermoelectric conversion region B can be maintained constant. In this case, a member susceptible to heat such as an integrated circuit and/or an integrated circuit device can be disposed in a position spaced apart from the thermoelectric conversion region B and/or the thermoelectric conversion region A.

The thermoelectric conversion device 1 may further include a temperature detection module. In this case, for example, the first thermoelectric conversion region A and/or the second thermoelectric conversion region B can be controlled based on the information about temperature acquired by the temperature detection module. The information about the temperature is, for example, the value of the temperature, the rate of change in the temperature, or the history of the temperature. However, the information about the temperature is not limited to the above examples. The thermoelectric conversion device 1 in FIGS. 1A and 1B includes a temperature detection module 28 disposed inside the protective layer 8. The temperature detection module 28 is located at the center of the thermoelectric conversion device 1 when it is viewed in the direction X. However, the location of the temperature detection module 28 is not limited to the above example. The temperature detection module 28 includes, for example, at least one selected from a thermocouple element, a resistance thermometer bulb, and a thermistor.

The thermoelectric conversion device 1 may further include a control module for controlling the voltage applied to the first thermoelectric conversion region A and/or the second thermoelectric conversion region B. The control module may be composed of, for example, an integrated circuit. The control module may include a power source that applies the voltage to the first thermoelectric conversion region A and/or the second thermoelectric conversion region B or may include a signal transmitter that transmits a control signal to a power source disposed separately from the control module. The control module may be connected to the temperature detection module 28.

The thermoelectric conversion device 1 may further include, for example, an optional member and/or an optional module other than the components described above. The thermoelectric conversion device of the present disclosure may include two or more thermoelectric conversion modules. The two or more thermoelectric conversion modules may be stacked in the direction X with an insulating layer interposed therebetween. It is only necessary that at least one thermoelectric conversion module selected from the two or more thermoelectric conversion modules be the thermoelectric conversion module 2 described above.

The thermoelectric conversion device 1 can be used as a Peltier-type cooling and/or heating device. An object to be heated and/or cooled by the thermoelectric conversion device 1 is, for example, a heat source. The heat source is, for example, an integrated circuit such as a CPU or a GPU or an integrated circuit device including the integrated circuit. However, the object is not limited to the above examples. The amount of heat generated by an integrated circuit varies irregularly depending on the load thereon. Therefore, although it is desirable that the temperature of the integrated circuit is constant, it is inevitable that the temperature of the integrated circuit varies irregularly. With the thermoelectric conversion device 1, for example, the irregular variations described above can be reduced, and the variations in the temperature of the integrated circuit are maintained within a prescribed range. In other words, the thermoelectric conversion device 1 is particularly advantageous when the object is an integrated circuit and/or an integrated circuit device.

The thermoelectric conversion device 1 may be used as a Seebeck-type power generator.

<Production Method>

The thermoelectric conversion device of the present disclosure can be produced using a combination of any of various thin film forming methods such as chemical vapor deposition (CVD), sputtering, and vapor deposition and any of various micromachining methods and pattern forming methods such as electron beam lithography, photolithography, block copolymer lithography, selective etching, and chemo-mechanical polishing (CMP). The block copolymer lithography is suitable for the formation of the phononic crystal structures.

An example of a method for producing a thermoelectric conversion element 21 including a phononic crystal layer will be described with reference to FIGS. 24A to 24O. However, the method for producing the thermoelectric conversion element that the thermoelectric conversion device 1 can include is not limited to the following example.

Figure 24A:
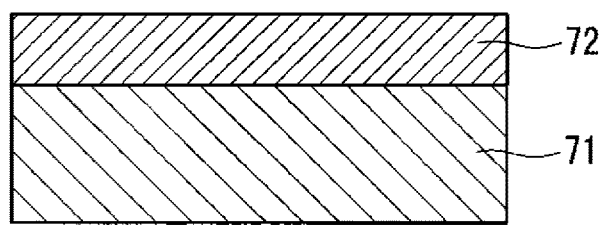
FIG. 24A is a schematic cross-sectional view illustrating an example of a method for producing the thermoelectric conversion element that the thermoelectric conversion device of the present disclosure can have.

FIG. 24A: A substrate 71 is prepared. An oxide film 72 has been provided on the upper surface of the substrate 71. The oxide film 72 is, for example, a SiO₂ film.

Figure 24B:
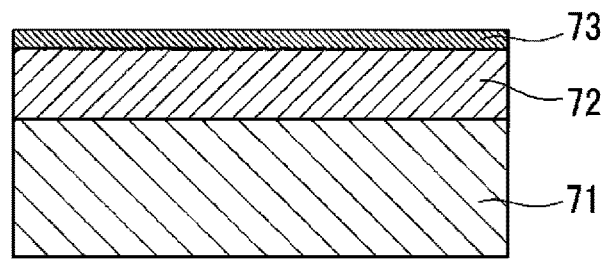
FIG. 24B is a schematic cross-sectional view illustrating the example of the method for producing the thermoelectric conversion element that the thermoelectric conversion device of the present disclosure can have.

FIG. 24B: A metal layer 73 is formed on the oxide film 72. The metal layer 73 later becomes the first electrode 24. The metal layer 73 is, for example, a Cr layer. The metal layer 73 is formed, for example, by sputtering. The thickness of the metal layer 73 is, for example, 50 nm.

Figure 24C:
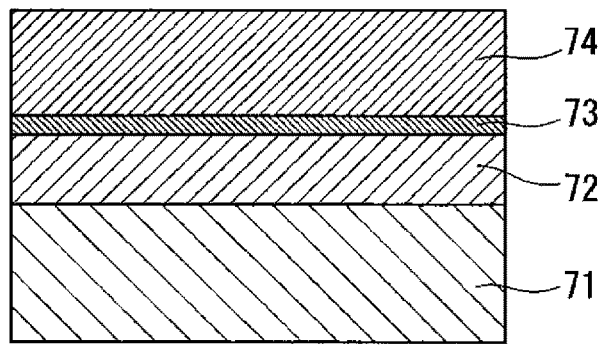
FIG. 24C is a schematic cross-sectional view illustrating the example of the method for producing the thermoelectric conversion element that the thermoelectric conversion device of the present disclosure can have.

FIG. 24C: A semiconductor layer 74 is formed on the metal layer 73. The semiconductor layer 74 is, for example, a polycrystalline Si layer. The semiconductor layer 74 is formed, for example, by CVD. The thickness of the semiconductor layer 74 is, for example, 200 nm.

Figure 24D:
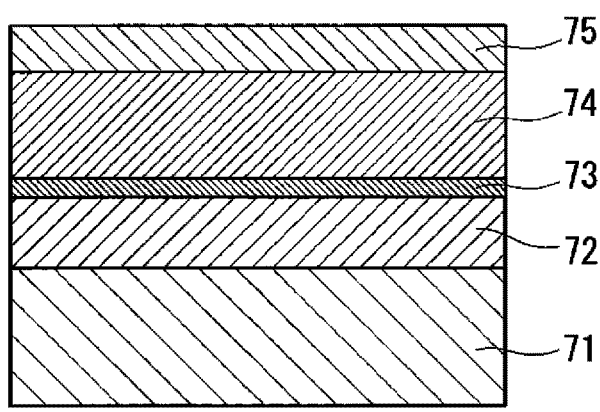
FIG. 24D is a schematic cross-sectional view illustrating the example of the method for producing the thermoelectric conversion element that the thermoelectric conversion device of the present disclosure can have.

FIG. 24D: A hard mask 75 is formed on the semiconductor layer 74. The hard mask 75 is, for example, a SiO₂ layer. The hard mask 75 is formed, for example, by CVD. The thickness of the hard mask 75 is, for example, 30 nm. The hard mask 75 is used to form a phononic crystal structure in the semiconductor layer 74.

Figure 24E:
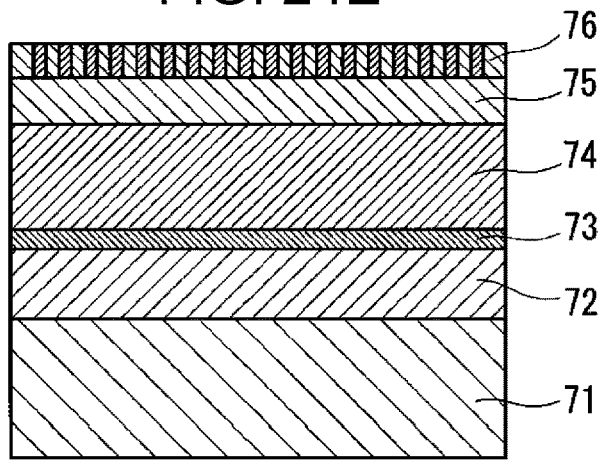
FIG. 24E is a schematic cross-sectional view illustrating the example of the method for producing the thermoelectric conversion element that the thermoelectric conversion device of the present disclosure can have.

FIG. 24E: A self-assembled film 76 of a block copolymer is formed on the hard mask 75. The self-assembled film 76 is used for block copolymer lithography for forming a phononic crystal structure.

Figure 24F:
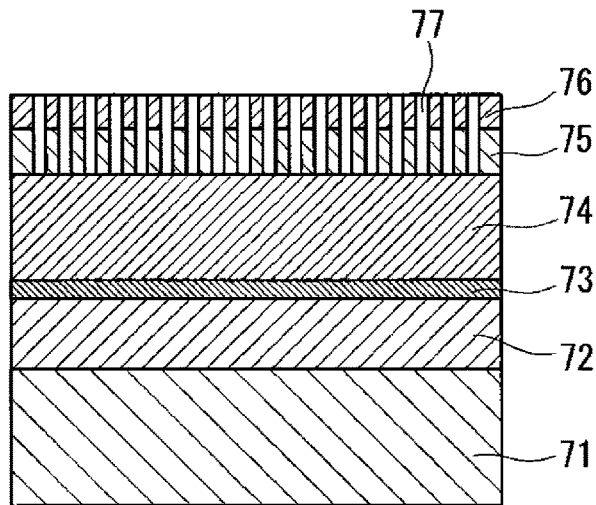
FIG. 24F is a schematic cross-sectional view illustrating the example of the method for producing the thermoelectric conversion element that the thermoelectric conversion device of the present disclosure can have.

FIG. 24F: A plurality of regularly arranged through holes 77 are formed in the hard mask 75 by block copolymer lithography.

Figure 24G:
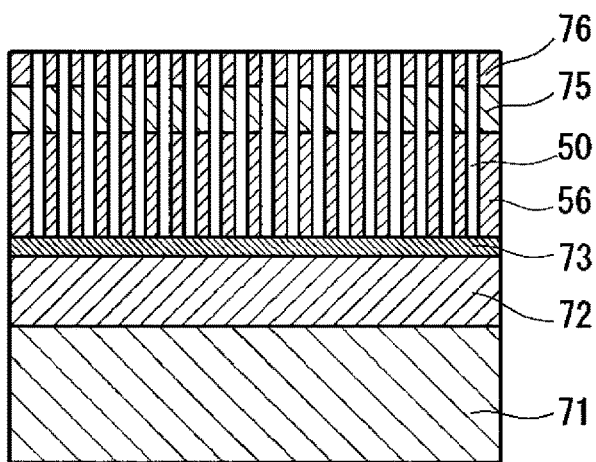
FIG. 24G is a schematic cross-sectional view illustrating the example of the method for producing the thermoelectric conversion element that the thermoelectric conversion device of the present disclosure can have.

FIG. 24G: A plurality of regularly arranged through holes 50 are formed in the semiconductor layer 74 by selective etching using the hard mask 75 as a resist at positions corresponding to the plurality of through holes 77 in plan view. The plurality of through holes 50 form a phononic crystal structure. The semiconductor layer 74 later becomes the phononic crystal layer 56.

Figure 24H:
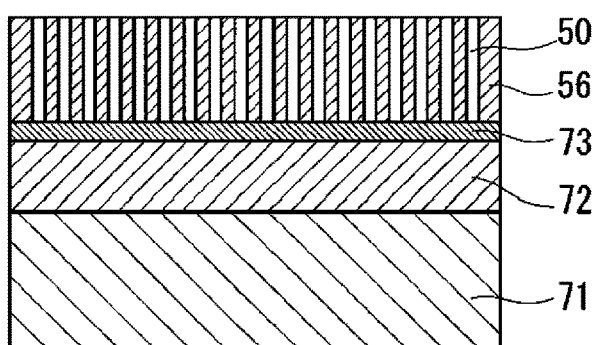
FIG. 24H is a schematic cross-sectional view illustrating the example of the method for producing the thermoelectric conversion element that the thermoelectric conversion device of the present disclosure can have.

FIG. 24H: The hard mask 75 and the self-assembled film 76 are removed.

Figure 24I:
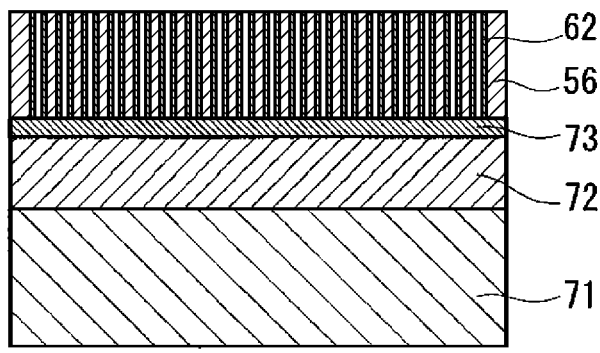
FIG. 24I is a schematic cross-sectional view illustrating the example of the method for producing the thermoelectric conversion element that the thermoelectric conversion device of the present disclosure can have.

FIG. 24I: An oxide film 62 is formed on the inner circumferential surface of each of the through holes 50 in the phononic crystal layer 56. The oxide film 62 is, for example, a SiO₂ film. The oxide film 62 is formed, for example, by thermal oxidation. The thickness of the oxide film 62 is, for example, 1 nm.

Figure 24J:
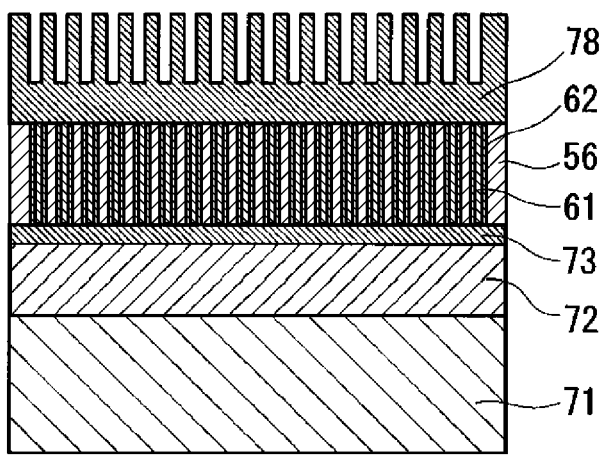
FIG. 24J is a schematic cross-sectional view illustrating the example of the method for producing the thermoelectric conversion element that the thermoelectric conversion device of the present disclosure can have.

FIG. 24J: The through holes 50 in the phononic crystal layer 56 are filled with a semiconductor to form pillars 61 having the oxide film 62 on their circumferential surface. The pillars 61 are formed of, for example, polycrystalline Si. The pillars 61 are formed, for example, by CVD. In this case, a layer 78 formed of the semiconductor material forming the pillars 61 is formed on the phononic crystal layer 56.

Figure 24K:
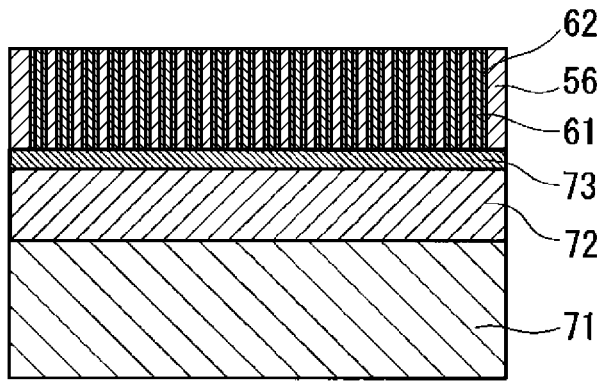
FIG. 24K is a schematic cross-sectional view illustrating the example of the method for producing the thermoelectric conversion element that the thermoelectric conversion device of the present disclosure can have.

FIG. 24K: The layer 78 is removed by a method such as CMP. In this manner, the phononic crystal layer 56 further including the pillars 61 is formed.

Figure 24L:
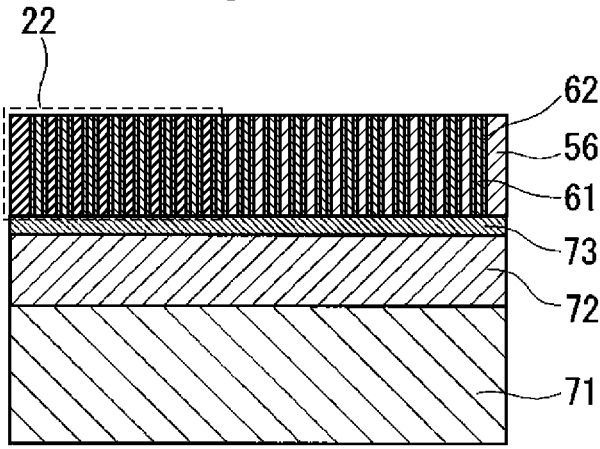
FIG. 24L is a schematic cross-sectional view illustrating the example of the method for producing the thermoelectric conversion element that the thermoelectric conversion device of the present disclosure can have.

FIG. 24L: Impurity ions are implanted into a partial region of the phononic crystal layer 56 using a method such as photolithography to dope the partial region with the impurity ions, and a p-type thermoelectric converter 22 is thereby formed. The impurity ions are, for example, boron ions.

Figure 24M:
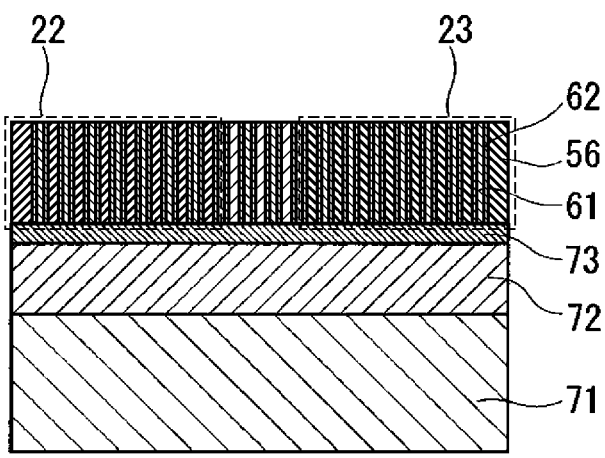
FIG. 24M is a schematic cross-sectional view illustrating the example of the method for producing the thermoelectric conversion element that the thermoelectric conversion device of the present disclosure can have.

FIG. 24M: Impurity ions are implanted into a region of the phononic crystal layer 56 that differs from the p-type thermoelectric converter 22 using a method such as photolithography to dope the region with the impurity ions, and an n-type thermoelectric converter 23 is thereby formed. The impurity ions are, for example, phosphorus ions. The p-type thermoelectric converter 22 is spaced apart from the n-type thermoelectric converter 23.

Figure 24N:
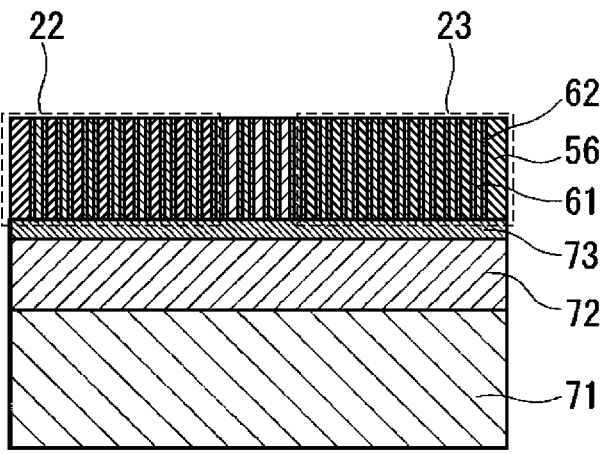
FIG. 24N is a schematic cross-sectional view illustrating the example of the method for producing the thermoelectric conversion element that the thermoelectric conversion device of the present disclosure can have.

FIG. 24N: The entire product is subjected to heat treatment (annealing) to activate the dopant impurity ions.

Figure 24O:
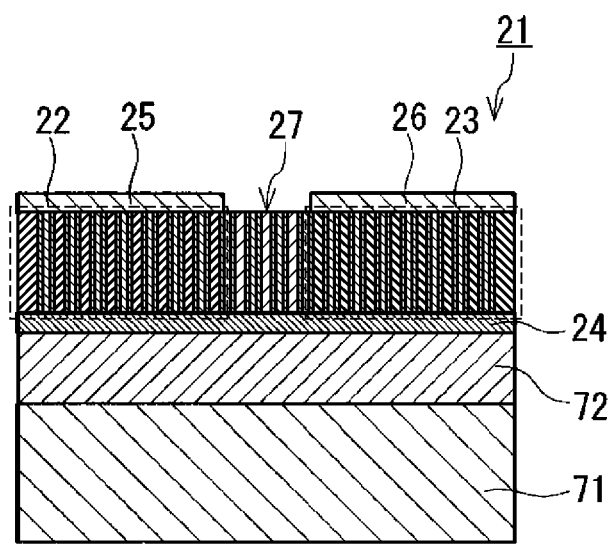
FIG. 24O is a schematic cross-sectional view illustrating the example of the method for producing the thermoelectric conversion element that the thermoelectric conversion device of the present disclosure can have.

FIG. 24O: A second electrode 25 is formed on the p-type thermoelectric converter 22. A third electrode 26 is formed on the n-type thermoelectric converter 23. The second electrode 25 and the third electrode 26 are formed of, for example, Al. A thermoelectric conversion element 21 is thereby formed. A region of the phononic crystal layer 56 that remains present between the p-type thermoelectric converter 22 and the n-type thermoelectric converter 23 serves as an insulating portion 27. The insulating portion 27 has a phononic crystal structure including the plurality of regularly arranged through holes 50. In this configuration, the in-plane thermal conductivity of a portion of the element 21 that is located between the p-type thermoelectric converter 22 and the n-type thermoelectric converter 23 can be reduced. The reduction in the in-plane thermal conductivity allows the thermoelectric conversion efficiency of the thermoelectric conversion element 21 and the thermoelectric conversion device 1 to be further improved.

Second Embodiment

Figure 25A:
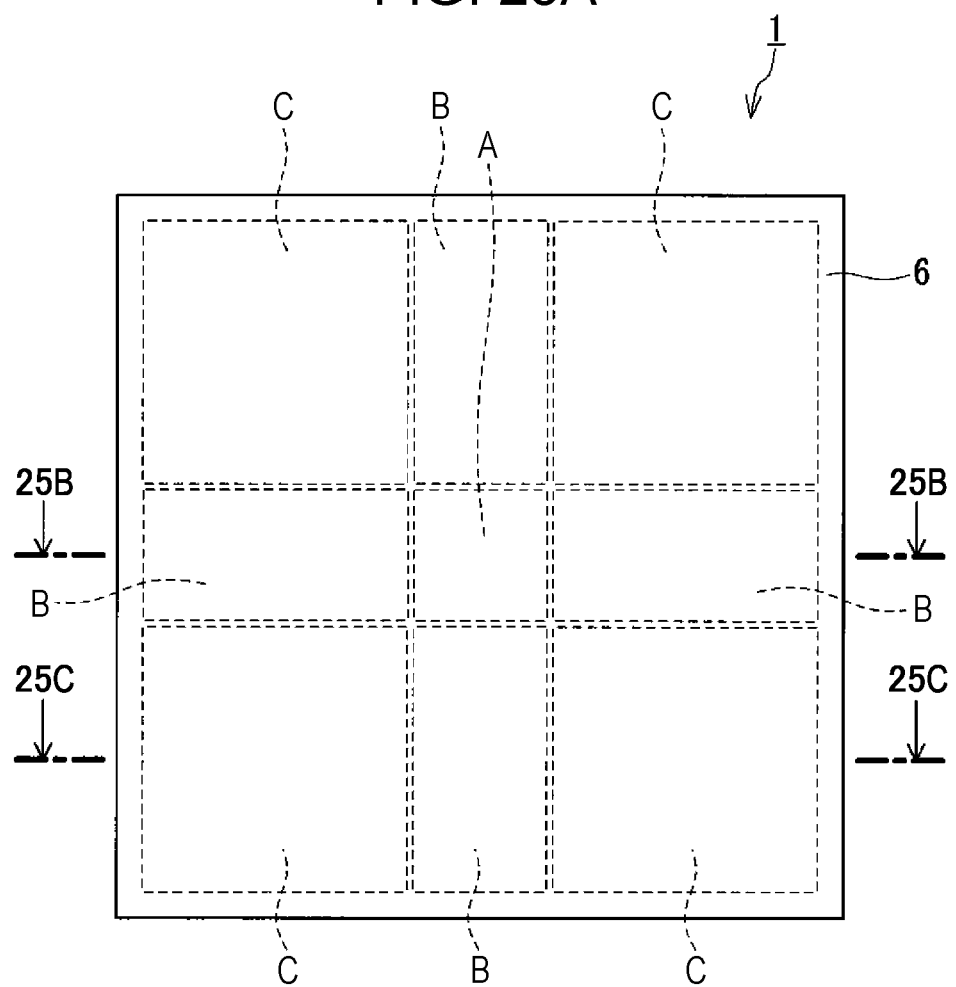
FIG. 25A is a plan view schematically showing another example of the thermoelectric conversion device of the present disclosure.
Figure 25B:
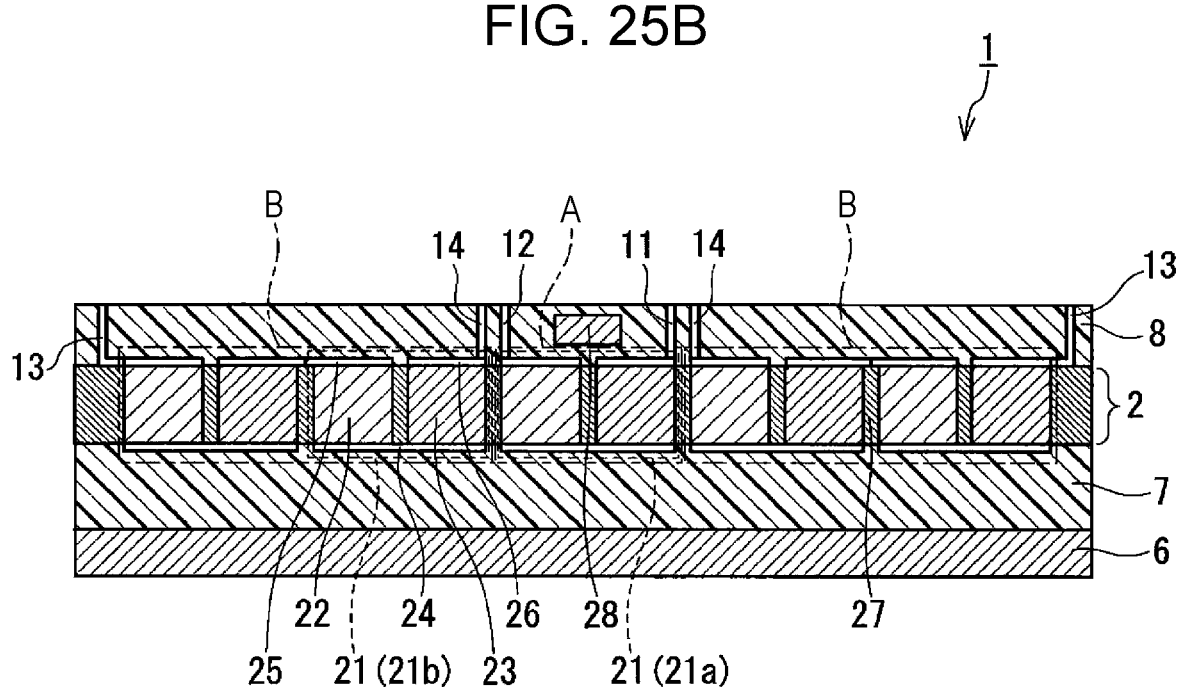
FIG. 25B is a cross-sectional view showing a cross section 25B-25B of the thermoelectric conversion device in FIG. 25A.
Figure 25C:
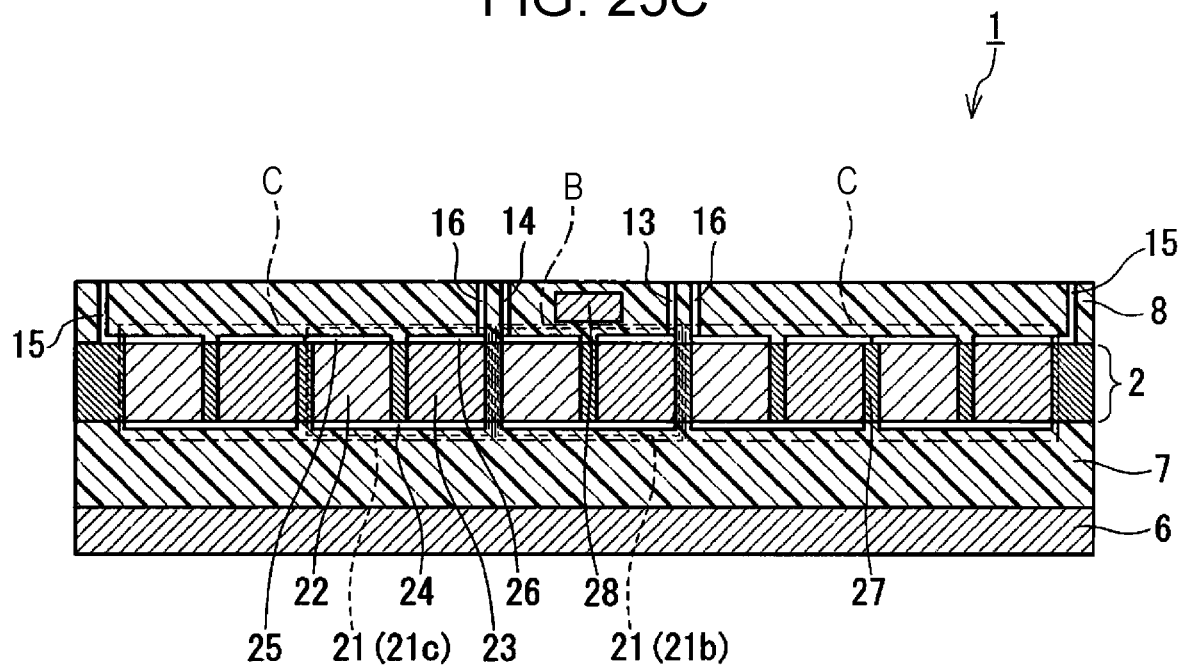
FIG. 25C is a cross-sectional view showing a cross section 25C-25C of the thermoelectric conversion device in FIG. 25A.

A thermoelectric conversion device in the second embodiment is showing in FIGS. 25A, 25B, and 25C. FIG. 25B is a cross-sectional view showing a cross section 25B-25B of the thermoelectric conversion device 1 in FIG. 25A. The cross section 25B-25B includes a first thermoelectric conversion region A and second thermoelectric conversion regions B. FIG. 25C is a cross-sectional view showing a cross section 25C-25C of the thermoelectric conversion device 1 in FIG. 25A. The cross section 25C-25C includes a second thermoelectric conversion region B and third thermoelectric conversion regions C. The thermoelectric conversion device 1 in the second embodiment has the same structure as that of the thermoelectric conversion device 1 in the first embodiment except that the thermoelectric conversion module 2 further has third thermoelectric conversion regions C. The first thermoelectric conversion region A has a square shape when viewed in the direction X perpendicular to the principal surface of the insulating layer 7. The thermoelectric conversion module 2 has four second thermoelectric conversion regions B. Each of the second thermoelectric conversion regions B has a rectangular shape when viewed in the direction X, and its short side is in contact with a side of the thermoelectric conversion region A. The first thermoelectric conversion region A is adjacent to each of the second thermoelectric conversion regions B. The thermoelectric conversion module 2 has four thermoelectric conversion regions C. Each of the third thermoelectric conversion regions C has a square shape when viewed in the direction X, and its two sides are in contact with long sides of different second thermoelectric conversion regions B. Each of the second thermoelectric conversion regions B is adjacent to corresponding thermoelectric conversion regions C. The distance between the center of mass of the first thermoelectric conversion region A and the center of mass of each of the third thermoelectric conversion regions C is larger than the distance between the center of mass of the first thermoelectric conversion region A and the center of mass of each of the second thermoelectric conversion regions B. In other words, the third thermoelectric conversion regions C are located farther from the first thermoelectric conversion region A than the second thermoelectric conversion regions B. The first thermoelectric conversion region A, the second thermoelectric conversion regions B, and the third thermoelectric conversion regions C are disposed in the same layer. The combination of the first thermoelectric conversion region A, the second thermoelectric conversion regions B, and the third thermoelectric conversion regions C forms a square thermoelectric conversion region when viewed in the direction X. The combination of the second thermoelectric conversion regions B and the third thermoelectric conversion regions C surrounds the first thermoelectric conversion region A when viewed in the direction X. However, in the thermoelectric conversion device of the present disclosure, the number of thermoelectric conversion regions included in the thermoelectric conversion module, the arrangement of the thermoelectric conversion regions, and their shape when they are viewed in the direction X are not limited to the above examples. The term "the center of mass" of a region as used herein means the center of mass when the region is viewed in the direction X.

Each of the third thermoelectric conversion regions C includes two or more thermoelectric conversion elements 21(21*c*), a fifth connection electrode 15, and a sixth connection electrode 16. In each third thermoelectric conversion region C, the thermoelectric conversion elements 21*c* are electrically connected to the fifth connection electrode 15 and the sixth connection electrode 16. Each thermoelectric conversion element 21*c* is located on an electric path connecting the connection electrodes 15 and 16 included in the third thermoelectric conversion region C. By applying a voltage through the connection electrodes 15 and 16, the thermoelectric conversion elements 21*c* and the third thermoelectric conversion regions C operate as Peltier elements and Peltier modules, respectively. The third thermoelectric conversion regions C may have the same structure as the structure of the first thermoelectric conversion region A and/or the structure of the second thermoelectric conversion regions B except for the features described above. In the thermoelectric conversion device 1 in the second embodiment, the thermoelectric conversion regions A, B, C can be controlled independently. By increasing the number of thermoelectric conversion regions that can be controlled independently, the degree of flexibility in controlling the cooling and/or heating of the object can be further improved.

Third Embodiment

Figure 26A:
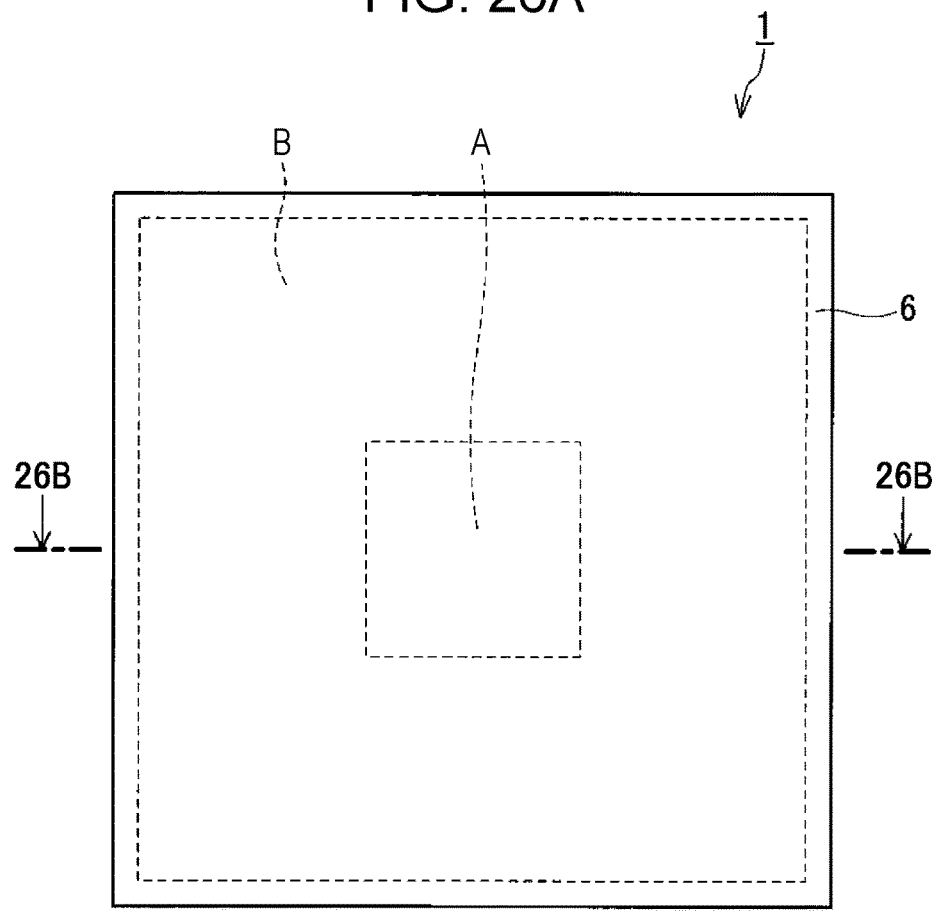
FIG. 26A is a cross-sectional view schematically showing yet another example of the thermoelectric conversion device of the present disclosure.
Figure 26B:
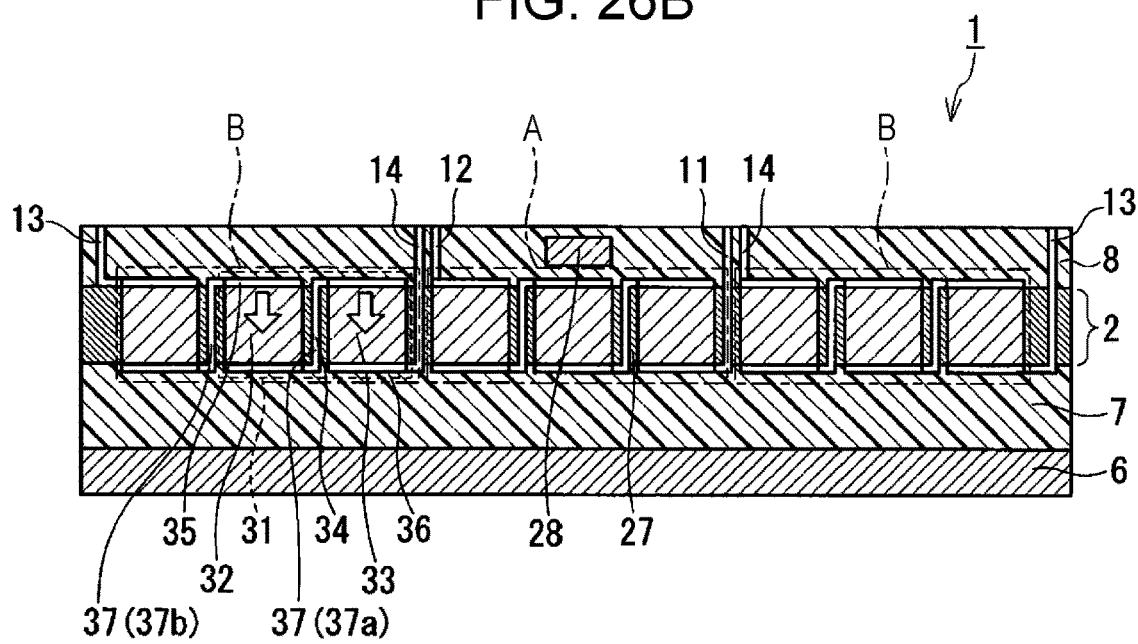
FIG. 26B is a cross-sectional view showing a cross section 26B-26B of the thermoelectric conversion device in FIG. 26A.

A thermoelectric conversion device in a third embodiment is shown in FIGS. 26A and 26B. FIG. 26B is a cross-sectional view showing a cross section 26B-26B of the thermoelectric conversion device 1 in FIG. 26A. Each of the thermoelectric conversion elements 21 in the first embodiment and the second embodiment includes a p-type thermoelectric converter 22 and an n-type thermoelectric converter 23 and is referred to as a π-type element by those skilled in the art. The thermoelectric conversion element that the thermoelectric conversion device of the present disclosure can have is not limited to the π-type element. The thermoelectric conversion device 1 in the third embodiment includes thermoelectric conversion elements 31 different from the π-type elements. The thermoelectric conversion device 1 in the third embodiment has the same structure as that of the thermoelectric conversion device 1 in the first embodiment except that the thermoelectric conversion elements 31 are provided instead of the thermoelectric conversion elements 21.

Each of the thermoelectric conversion elements 31 includes two thermoelectric converters 32 and 33 adjacent to each other. The thermoelectric converters 32 and 33 have the same conductivity type. In other words, each thermoelectric conversion element 31 has two p-type or n-type thermoelectric converters adjacent to each other. Each thermoelectric conversion element 31 includes a fourth electrode 34, a fifth electrode 35, and a sixth electrode 36. A first end of the thermoelectric converter 32 and a first end of the thermoelectric converter 33 are electrically connected to each other through the fourth electrode 34. The fourth electrode 34 electrically connects the lower surface of the thermoelectric converter 32 to the upper surface of the thermoelectric converter 33. The fourth electrode 34 includes a via line 37(37*a*) extending in the direction X. A second end of the thermoelectric converter 32 is electrically connected to the fifth electrode 35. A second end of the thermoelectric converter 33 is electrically connected to the sixth electrode 36. One selected from the fifth electrode 35 and the sixth electrode 36 is disposed on an electric path connecting the corresponding connection electrodes and located on the upstream side in the path. The other selected from the fifth electrode 35 and the sixth electrode 36 is disposed on the electric path connecting the corresponding connection electrodes and located on the downstream side in the path. In other words, a voltage can be applied to the thermoelectric conversion element 31 through the fifth electrode 35 and the sixth electrode 36. In the thermoelectric conversion element 31, a direction connecting a pair of electrodes holding one of the thermoelectric converters therebetween is generally the direction X. When an electric current is caused to flow through the electric path, the directions of the electric current flowing through the two adjacent thermoelectric converters 32 and 33 are the same (see arrows in FIG. 26B) as each other. The thermoelectric conversion element 31 is known as a uni-leg type element to those skilled in the art.

Each of the thermoelectric conversion regions A and B in FIG. 26 includes two or more thermoelectric conversion elements 31. In two elements 31 adjacent to each other, the fifth electrode 35 of one element 31 and the sixth electrode 36 of the other element 31 are electrically connected through a via line 37(37b) extending in the direction X.

Each thermoelectric conversion element 31 can have any known uni-leg type structure so long as the thermoelectric converters each have a phononic crystal layer.

[Method for Controlling Thermoelectric Conversion Device]

Figure 27:
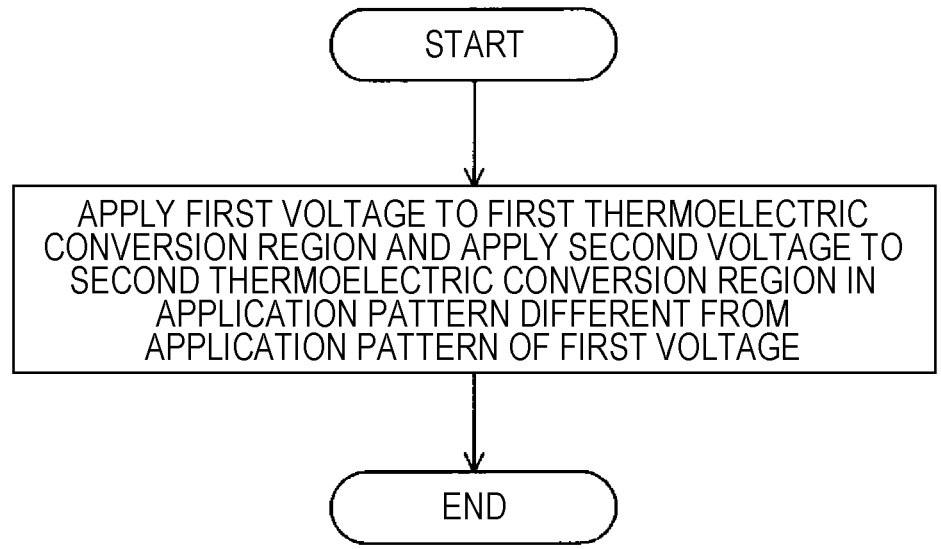
FIG. 27 is a flowchart showing an example of a control method in the present disclosure.

An example of a method for controlling the thermoelectric conversion device 1 is shown in FIG. 27. The control method in FIG. 27 includes a step of applying a first voltage to a first thermoelectric conversion region A and applying a second voltage to a second thermoelectric conversion region B. The application pattern of the first voltage differs from the application pattern of the second voltage. The control method in FIG. 27 is a method for independently controlling the thermoelectric conversion regions included in the thermoelectric conversion module 2 in a thermoelectric conversion device 1. When the thermoelectric conversion module 2 includes three or more thermoelectric conversion regions, the above control can be performed with one of the thermoelectric conversion regions used as the first thermoelectric conversion region A and another one of the thermoelectric conversion regions used as the second thermoelectric conversion region B.

Examples of the form of the application pattern are as follows. However, the form of the application pattern is not limited to the following examples.
At least one selected from the effective voltage value, the maximum voltage value, and the minimum voltage value is different.
At least one selected from the width of pulses, their period, their waveform, and the duty cycle during the application of the pulses is different.

When the thermoelectric conversion device includes the first temperature detection module 28, the application pattern of the first voltage and/or the application pattern of the second voltage may be controlled based on the information about the temperature acquired by the temperature detection module 28.

The object to be cooled and/or heated by the thermoelectric conversion device 1 may be disposed near the thermoelectric conversion device 1. The object is, for example, a heat source. Examples of the heat source are as described above. The object is disposed, for example, at a position opposite to the substrate 6 of the thermoelectric conversion device 1. The object may be in contact with the thermoelectric conversion device 1. The object may be in contact with the protective layer, the insulating layer, or the thermoelectric conversion module of the thermoelectric conversion device 1. The object may be in contact with at least one thermoelectric conversion region selected from two or more thermoelectric conversion regions included in the thermoelectric conversion module or may be in contact with only one thermoelectric conversion region. In this case, at least one selected from the following control A, control B, and control C may be performed.

Control A: The object includes a second temperature detection module, or the second temperature detection module is disposed between the object and the thermoelectric conversion device 1. Based on the information about temperature acquired by the second temperature detection module, the application pattern of the first voltage and/or the application pattern of the second voltage is controlled. In this manner, the degree of flexibility in controlling the cooling and/or heating of the object can be further improved.

Control B: The application pattern of the first voltage and/or the application pattern of the second voltage is controlled such that the voltage applied to a thermoelectric conversion region that is selected from a group of thermoelectric conversion regions included in the thermoelectric conversion module 2 and is closer to the object is changed more frequently than the voltage applied to a thermoelectric conversion region farther from the object. The group of thermoelectric conversion regions in each of embodiments 1 and 3 includes the first thermoelectric conversion region A and the second thermoelectric conversion region B. The group of thermoelectric conversion regions in embodiment 2 includes the first thermoelectric conversion region A, the second thermoelectric conversion regions B, and the third thermoelectric conversion regions C. Among a thermoelectric conversion region group including three of more thermoelectric conversion regions, any two thermoelectric conversion regions may be selected as the first thermoelectric conversion region A and the second thermoelectric conversion region B to which the first voltage and the second voltage, respectively, are to be applied. The distance between the center of mass of the object and the center of mass of a thermoelectric conversion region may be defined as the distance between them. When the object is a heat source, the distance between the point in the object that has the highest temperature and the center of mass of a thermoelectric conversion region may be defined as the distance between the object and the thermoelectric conversion region.

Control C: The application pattern of the first voltage and/or the application pattern of the second voltage is controlled such that variations in the temperature of the object are within a prescribed range.

Figure 28:
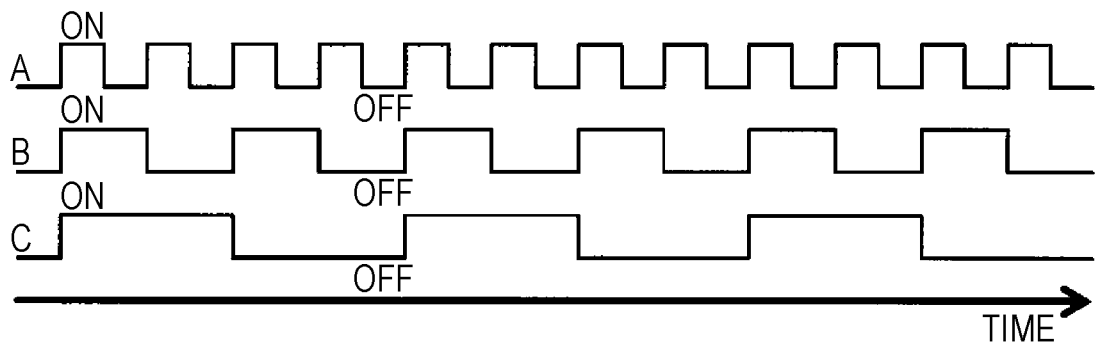
FIG. 28 is a graph showing voltage application patterns in an example of the control method in the present disclosure.
Figure 29:
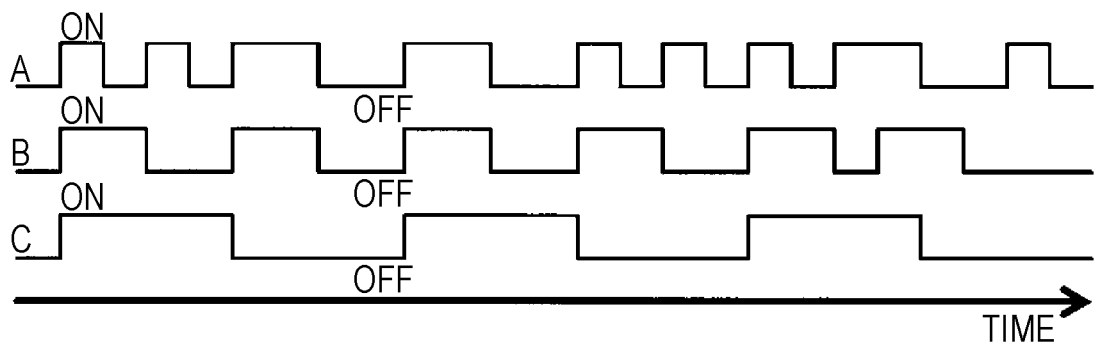
FIG. 29 is a graph showing voltage application patterns in an example of the control method in the present disclosure.

A more specific example of the control B is shown in FIGS. 28 and 29. A control method in FIGS. 28 and 29 is a method for controlling a thermoelectric conversion device 1 including three thermoelectric conversion regions. In the control method in FIGS. 28 and 29, the voltage application patterns are controlled such that the voltage applied to a thermoelectric conversion region A closest to the object is changed more frequently than the voltages applied to thermoelectric conversion regions B and C farther from the object. Moreover, the voltage application patterns are controlled such that the voltage applied to the thermoelectric conversion region B is changed more frequently than the voltage applied to the thermoelectric conversion region C farther from the object than the thermoelectric conversion region B. In the control in FIG. 29, voltages are applied irregularly to the thermoelectric conversion regions A and B.

The above control method is also a method for cooling and/or heating the object using the thermoelectric conversion device 1. In other words, in another aspect different from the above aspect, the present disclosure provides a method for cooling and/or heating an object using a thermoelectric conversion device. In this method, the thermoelectric conversion device is the thermoelectric conversion device of the present disclosure. The method includes a step of applying a first voltage to a first thermoelectric conversion region of the thermoelectric conversion device and applying a second voltage to a second thermoelectric conversion region in an application pattern different from that for the first voltage. In this method, one or two tor more types of control described above can be performed.

[Electronic Device]

In another aspect, the present disclosure provides an electronic device including an integrated circuit and a thermoelectric conversion device that cools and/or heats the integrated circuit. The thermoelectric conversion device is the thermoelectric conversion device of the present disclosure. Examples of the electronic device are as described above.

INDUSTRIAL APPLICABILITY

The thermoelectric conversion device of the present disclosure can be used as, for example, a Peltier-type cooling device and/or a Peltier-type heating device.

Examples of the invention derived from the above-disclosed contents are enumerated below.

(Item 1)

A thermoelectric conversion device including:
an insulating layer; and
a thermoelectric conversion module disposed on the insulating layer,
wherein the thermoelectric conversion module has a first thermoelectric conversion region and a second thermoelectric conversion region,
wherein the first thermoelectric conversion region includes at least one thermoelectric conversion element, a first connection electrode, and a second connection electrode,
wherein the at least one thermoelectric conversion element in the first thermoelectric conversion region is electrically connected to the first connection electrode and the second connection electrode and located on an electric path connecting the first connection electrode and the second connection electrode,
wherein the second thermoelectric conversion region includes at least one thermoelectric conversion element, a third connection electrode, and a fourth connection electrode,
wherein the at least one thermoelectric conversion element in the second thermoelectric conversion region is electrically connected to the third connection electrode and the fourth connection electrode and located on an electric path connecting the third connection electrode and the fourth connection electrode,
wherein each of the at least one thermoelectric conversion element in the first thermoelectric conversion region and the at least one thermoelectric conversion element in the second thermoelectric conversion region includes a thermoelectric converter,
wherein the thermoelectric converter includes a phononic crystal layer having a phononic crystal structure including a plurality of regularly arranged through holes, and
wherein a through direction of the plurality of through holes is substantially parallel to a direction perpendicular to a principal surface of the insulating layer.

(Item 2)

The thermoelectric conversion device according to Item 1, wherein the at least one thermoelectric conversion element in the first thermoelectric conversion region includes two or more thermoelectric conversion elements.

(Item 3)

The thermoelectric conversion device according to Item 1, wherein the at least one thermoelectric conversion element in the second thermoelectric conversion region includes two or more thermoelectric conversion elements.

(Item 4)

The thermoelectric conversion device according to Item 2, wherein the two or more thermoelectric conversion elements are electrically connected in series between the first connection electrode and the second connection electrode.

(Item 5)

The thermoelectric conversion device according to Item 3, wherein the two or more thermoelectric conversion elements are electrically connected in series between the first connection electrode and the second connection electrode.

(Item 6)

The thermoelectric conversion device according to any one of Items 1 to 5, wherein the at least one thermoelectric conversion element in at least one thermoelectric conversion region selected from the group consisting of the first thermoelectric conversion region and the second thermoelectric conversion region includes:
a p-type thermoelectric converter;
an n-type thermoelectric converter;
a first electrode;
a second electrode; and
a third electrode,
wherein the thermoelectric converter includes the p-type thermoelectric converter and the n-type thermoelectric converter,
wherein a first end of the p-type thermoelectric converter and a first end of the n-type thermoelectric converter are electrically connected to each other through the first electrode,
wherein a second end of the p-type thermoelectric converter is electrically connected to the second electrode,
wherein a second end of the n-type thermoelectric converter is electrically connected to the third electrode,
wherein one selected from the second electrode and the third electrode is disposed on the electric path and located on an upstream side therein, and
wherein the other selected from the second electrode and the third electrode is disposed on the electric path and located on a downstream side therein.

(Item 7)

The thermoelectric conversion device according to any one of Items 1 to 5, wherein the at least one thermoelectric conversion element in at least one thermoelectric conversion region selected from the group consisting of the first thermoelectric conversion region and the second thermoelectric conversion region includes:
two p-type thermoelectric converters adjacent to each other;
a fourth electrode;
a fifth electrode; and
a sixth electrode, wherein the thermoelectric converter includes the two p-type thermoelectric converters, wherein a first end of a first one of the thermoelectric converters and a first end of a second one of the thermoelectric converters are electrically connected to each other through the fourth electrode, wherein a second end of the first one of the thermoelectric converters is electrically connected to the fifth electrode, wherein a second end of the second one of the thermoelectric converters is electrically connected to the sixth electrode, wherein one selected from the fifth electrode and the sixth electrode is disposed on the electric path and located on an upstream side therein, wherein the other selected from the fifth electrode and the sixth electrode is disposed on the electric path and located on a downstream side therein, and wherein, when an electric current is caused to flow through the electric path, the directions of the electrode current flowing through the two adjacent thermoelectric converters are the same.

(Item 8)

The thermoelectric conversion device according to any one of Items 1 to 5, wherein the at least one thermoelectric conversion element in at least one thermoelectric conversion region selected from the group consisting of the first thermoelectric conversion region and the second thermoelectric conversion region includes:

two n-type thermoelectric converters adjacent to each other;

a fourth electrode;

a fifth electrode; and a sixth electrode, wherein the thermoelectric converter includes the two n-type thermoelectric converters, wherein a first end of a first one of the thermoelectric converters and a first end of a second one of the thermoelectric converters are electrically connected to each other through the fourth electrode, wherein a second end of the first one of the thermoelectric converters is electrically connected to the fifth electrode, wherein a second end of the second one of the thermoelectric converters is electrically connected to the sixth electrode, wherein one selected from the group consisting of the fifth electrode and the sixth electrode is disposed on the electric path and located on an upstream side therein, wherein the other selected from the group consisting of the fifth electrode and the sixth electrode is disposed on the electric path and located on a downstream side therein, and wherein, when an electric current is caused to flow through the electric path, the directions of the electrode current flowing through the two adjacent thermoelectric converters are the same.

(Item 9)

The thermoelectric conversion device according to any one of Items 1 to 8, wherein the phononic crystal layer includes a first phononic crystal layer and a second phononic crystal layer, wherein the first phononic crystal layer has a first phononic crystal structure including a plurality of regularly arranged first through holes that are part of the through holes, wherein the second phononic crystal layer has a second phononic crystal structure including a plurality of regularly arranged second through holes that are part of the through holes, and wherein the first phononic crystal layer and the second phononic crystal layer are stacked in a direction perpendicular to the principal surface of the insulating layer.

(Item 10)

The thermoelectric conversion device according to Item 9, wherein the first phononic crystal layer and the second phononic crystal layer are in contact with each other.

(Item 11)

The thermoelectric conversion device according to Item 9 or 10, wherein at least part of the second through holes are not in communication with the first through holes.

(Item 12)

The thermoelectric conversion device according to any one of Items 1 to 11, wherein the phononic crystal structure has a first domain and a second domain that are phononic crystal regions, wherein the plurality of through holes in the first domain are arranged regularly in a first direction in a cross section perpendicular to the through direction of the through holes, and wherein the plurality of through holes in the second domain are arranged regularly in a second direction different from the first direction in the cross section perpendicular to the through direction of the through holes.

(Item 13)

The thermoelectric conversion device according to any one of Items 1 to 10, wherein the phononic crystal layer includes a plurality of pillars, wherein the pillars are columnar bodies extending linearly, and wherein each of the pillars is filled into a corresponding one of the through holes in the phononic crystal layer.

(Item 14)

The thermoelectric conversion device according to Item 13, wherein the phononic crystal layer with the pillars filled thereinto and the pillars are formed of the same material as each other, and a circumferential surface of each of the pillars is covered with an oxide film.

(Item 15)

The thermoelectric conversion device according to any one of Items 1 to 14, further including a temperature detection module.

(Item 16)

The thermoelectric conversion device according to any one of Items 1 to 15, further including a control module for controlling a voltage applied to at least one thermoelectric conversion region selected from the group consisting of the first thermoelectric conversion region and the second thermoelectric conversion region.

(Item 17)

A method for controlling a thermoelectric conversion device, the method including a step of applying a first voltage and a second voltage to the first thermoelectric conversion region and the second thermoelectric conversion region, respectively, of the thermoelectric conversion device according to any one of Items 1 to 16, wherein an application pattern of the first voltage differs from an application pattern of the second voltage.

(Item 18)

The method for controlling according to Item 17, wherein the thermoelectric conversion device includes a first temperature detection module, wherein the application pattern of at least one voltage selected from the group consisting of the first voltage and the second voltage is controlled based on information about temperature acquired by the first temperature detection module.

(Item 19)

The method for controlling according to Item 17 or 18, wherein an object to be cooled and/or heated by the thermoelectric conversion device is disposed near the thermoelectric conversion device.

(Item 20)

The method for controlling according to Item 19, wherein the object includes a second temperature detection module, or the second temperature detection module is disposed between the object and the thermoelectric conversion device, and wherein the application pattern of at least one voltage selected from the group consisting of the first voltage and the second voltage is controlled based on information about temperature acquired by the second temperature detection module.

(Item 21)

The method for controlling according to Item 19 or 20, wherein the application pattern of at least one voltage selected from the group consisting of the first voltage and the second voltage is controlled such that a voltage applied to a thermoelectric conversion region that is selected from the first thermoelectric conversion region and the second thermoelectric conversion region and is located closer to the object is changed more frequently than a voltage applied to a thermoelectric conversion region that is selected from the first thermoelectric conversion region and the second thermoelectric conversion region and is located farther from the object.

(Item 22)

The method for controlling according to any one of Items 17 to 21, wherein the application pattern of at least one voltage selected from the group consisting of the first voltage and the second voltage is controlled such that variations in temperature of the object are within a prescribed range.

(Item 23)

The method for controlling according to any one of Items 17 to 22, wherein the object is a heat source.

(Item 24)

A method for cooling and/or heating an object using a thermoelectric conversion device, wherein the thermoelectric conversion device is the thermoelectric conversion device according to any of Items 1 to 16, wherein the method includes a step of applying a first voltage and a second voltage to the first thermoelectric conversion region and the second thermoelectric conversion region, respectively, of the thermoelectric conversion device, and wherein an application pattern of the first voltage differs from an application pattern of the second voltage.

(Item 25)

An electronic device including:

an integrated circuit; and a thermoelectric conversion device that cools and/or heats the integrated circuit, wherein the thermoelectric conversion device is the thermoelectric conversion device according to any of Items 1 to 16.

REFERENCE SIGNS LIST 1 thermoelectric conversion device
2 thermoelectric conversion module
6 substrate
7 insulating layer
8 protective layer
A first thermoelectric conversion region
B second thermoelectric conversion region
11 first connection electrode
12 second connection electrode
13 third connection electrode
14 fourth connection electrode
21 thermoelectric conversion element (π type)
22 p-type thermoelectric converter
23 n-type thermoelectric converter
24 first electrode
25 second electrode
26 third electrode
27 insulator
28 temperature detection module
31 thermoelectric conversion element (uni-leg type)
32, 33 thermoelectric converter
34 fourth electrode
35 fifth electrode
36 sixth electrode
43 first through hole
44 first phononic crystal layer
45 second through hole
46 second phononic crystal layer
50 through hole
51A first domain
51B second domain
52 phononic polycrystal structure
53A, 53B orientation
55 interface
56 phononic crystal layer
61 pillar
62 oxide film
91, 91A, 91B unit cell

The invention claimed is:

1. A thermoelectric conversion device comprising:

an insulating layer; and a thermoelectric conversion module disposed on the insulating layer, wherein:

the thermoelectric conversion module comprises a first thermoelectric conversion region and a second thermoelectric conversion region, each of the first thermoelectric conversion region and the second thermoelectric conversion region comprises one or two or more thermoelectric conversion elements, the first thermoelectric conversion region comprises a first connection electrode, and a second connection electrode, the one or two or more thermoelectric conversion elements in the first thermoelectric conversion region are electrically connected to the first connection electrode and the second connection electrode and located on an electric path connecting the first connection electrode and the second connection electrode, the second thermoelectric conversion region comprises a third connection electrode, and a fourth connection electrode, the one or two or more thermoelectric conversion elements in the second thermoelectric conversion region are electrically connected to the third connection electrode and the fourth connection electrode and located on an electric path connecting the third connection electrode and the fourth connection electrode, each of the one or two or more thermoelectric conversion elements comprises a thermoelectric converter, the thermoelectric converter of at least one of the one or two or more thermoelectric conversion elements comprises a phononic crystal layer having a phononic crystal structure comprising a plurality of regularly arranged through holes, a through direction of the plurality of regularly arranged through holes in the phononic crystal structure is substantially parallel to a vertical direction perpendicular to a principal surface of the insulating layer, the phononic crystal structure comprises a first domain and a second domain that are phononic crystal regions, the plurality of regularly arranged through holes in the first domain constitute a first unit lattice, the first unit lattice having a first orientation in a cross section perpendicular to the through direction of the through holes, and the plurality of regularly arranged through holes in the second domain constitute a second unit lattice, the second unit lattice having a second orientation different from the first orientation in the cross section perpendicular to the through direction of the through holes.

2. The thermoelectric conversion device according to claim 1, wherein the thermoelectric conversion device satisfies at least one of (i) the one or two or more thermoelectric conversion elements in the first thermoelectric conversion region comprise two or more thermoelectric conversion elements, or (ii) the one or two or more thermoelectric conversion elements in the second thermoelectric conversion region comprise two or more thermoelectric conversion elements.

3. The thermoelectric conversion device according to claim 1, wherein the thermoelectric conversion device satisfies at least one selected from the group consisting of the following (a) and (b):
(a) the one or two or more thermoelectric conversion elements in the first thermoelectric conversion region comprise two or more thermoelectric conversion elements, the two or more thermoelectric conversion elements in the first thermoelectric conversion region being electrically connected to each other in series between the first connection electrode and the second connection electrode; and
(b) the one or two or more thermoelectric conversion elements in the second thermoelectric conversion region comprise two or more thermoelectric conversion elements, the two or more thermoelectric conversion elements in the second thermoelectric conversion region being electrically connected to each other in series between the third connection electrode and the fourth connection electrode.

4. The thermoelectric conversion device according to claim 1, wherein:
the thermoelectric converter of each of the one or two or more thermoelectric conversion elements in at least one of the first thermoelectric conversion region or the second thermoelectric conversion region comprises:
a p-type thermoelectric converter and an n-type thermoelectric converter;
a first electrode;
a second electrode; and
a third electrode,
a first end of the p-type thermoelectric converter and a first end of the n-type thermoelectric converter are electrically connected to each other through the first electrode,
a second end of the p-type thermoelectric converter is electrically connected to the second electrode, and
a second end of the n-type thermoelectric converter is electrically connected to the third electrode.

5. The thermoelectric conversion device according to claim 1, wherein:
the thermoelectric converter of each of the one or two or more thermoelectric conversion elements in at least one of the first thermoelectric conversion region or the second thermoelectric conversion region comprises:
a pair of thermoelectric converters;
a first electrode;
a second electrode; and
a third electrode,
the pair of thermoelectric converters include a first thermoelectric converter and a second thermoelectric converter adjacent to each other,
the first thermoelectric converter and the second thermoelectric converter have a same conductivity type,
a first end of the first thermoelectric converter and a second end of the second thermoelectric converter are electrically connected to each other through the first electrode,
a second end of the first thermoelectric converter is electrically connected to the second electrode,
a first end of the second thermoelectric converter is electrically connected to the third electrode, and
the first end of the first thermoelectric converter and the first end of the second thermoelectric converter are located at a same side in the vertical direction.

6. The thermoelectric conversion device according to claim 1, wherein:
the phononic crystal layer of the thermoelectric converter of the at least one of the thermoelectric conversion elements comprises a first phononic crystal layer and a second phononic crystal layer, which have a same conductivity type,
the first phononic crystal layer includes a first phononic crystal structure comprising a plurality of regularly arranged first through holes,
the second phononic crystal layer includes a second phononic crystal structure comprising a plurality of regularly arranged second through holes,
an arrangement pattern of the plurality of regularly arranged first through holes is different from an arrangement pattern of the plurality of regularly arranged second through holes, and
the first phononic crystal layer and the second phononic crystal layer are stacked in the direction perpendicular to the principal surface of the insulating layer.

7. The thermoelectric conversion device according to claim 6, wherein the first phononic crystal layer and the second phononic crystal layer are in direct contact with each other.

8. The thermoelectric conversion device according to claim 6, wherein at least part of the second through holes are not in communication with the first through holes.

9. The thermoelectric conversion device according to claim 1, wherein:
the phononic crystal layer comprises a plurality of pillars,
the plurality of pillars are columnar bodies extending linearly,
each of the plurality of pillars is filled into a corresponding one of the through holes in the phononic crystal layer, and
the phononic crystal layer with the plurality of pillars filled thereinto and the pillars are formed of the same material, and a circumferential surface of each of the plurality of pillars is covered with an oxide film.

10. The thermoelectric conversion device according to claim 1, further comprising a temperature detection module.

11. The thermoelectric conversion device according to claim 1, further comprising a control module that controls at least one voltage selected from the group consisting of a voltage applied to the first thermoelectric conversion region and a voltage applied to the second thermoelectric conversion region.

12. A method for controlling the thermoelectric conversion device according to claim 1, the method comprising a step of applying a first voltage to the first thermoelectric conversion region of the thermoelectric conversion device and applying a second voltage to the second thermoelectric conversion region, wherein an application pattern of the first voltage differs from an application pattern of the second voltage.

13. The method for controlling according to claim 12, wherein the thermoelectric conversion device comprises a first temperature detection module, and wherein at least one application pattern selected from the group consisting of the application pattern of the first voltage and the application pattern of the second voltage is controlled based on information about temperature acquired by the first temperature detection module.

14. The method for controlling according to claim 12, wherein an object to be cooled and/or heated by the thermoelectric conversion device is disposed near the thermoelectric conversion device.

15. The method for controlling according to claim 14, wherein the object comprises a second temperature detection module, or the second temperature detection module is disposed between the object and the thermoelectric conversion device, and wherein at least one application pattern selected from the group consisting of the application pattern of the first voltage and the application pattern of the second voltage is controlled based on information about temperature acquired by the second temperature detection module.

16. The method for controlling according to claim 14, wherein at least one application pattern selected from the group consisting of the application pattern of the first voltage and the application pattern of the second voltage is controlled such that a voltage applied to a thermoelectric conversion region that is selected from the first thermoelectric conversion region and the second thermoelectric conversion region and is located closer to the object is changed more frequently than a voltage applied to a thermoelectric conversion region that is selected from the first thermoelectric conversion region and the second thermoelectric conversion region and is located farther from the object.

17. The method for controlling according to claim 14, wherein the application pattern of the first voltage and/or the application pattern of the second voltage is controlled such that variations in temperature of the object are within a prescribed range.

18. The method for controlling according to claim 14, wherein the object is a heat source.

19. A method for cooling and/or heating an object using the thermoelectric conversion device according to claim 1, wherein the method comprises a step of applying a first voltage to the first thermoelectric conversion region of the thermoelectric conversion device and applying a second voltage to the second thermoelectric conversion region, and wherein an application pattern of the first voltage differs from an application pattern of the second voltage.

20. An electronic device comprising:

an integrated circuit; and the thermoelectric conversion device according to claim 1, which cools and/or heats the integrated circuit.

21. The thermoelectric conversion device according to claim 1, wherein the first thermoelectric conversion region and the second thermoelectric conversion region are disposed on a same plane parallel to an upper surface of the insulating layer.

* * * * *